United States Patent [19]

Matsushita et al.

[11] Patent Number: 5,268,786
[45] Date of Patent: Dec. 7, 1993

[54] OPTICAL FIBER AMPLIFIER AND ITS AMPLIFICATION METHOD

[75] Inventors: Kiwami Matsushita; Takashi Mizuochi; Mayumi Miyazaki; Tadayoshi Kitayama, all of Kanagawa, Japan

[73] Assignee: Mitsubishi Denki Kabushiki Kaisha, Tokyo, Japan

[21] Appl. No.: 847,753

[22] Filed: Mar. 5, 1992

[30] Foreign Application Priority Data

| Mar. 15, 1991 | [JP] | Japan | 3-51470 |
| Jun. 12, 1991 | [JP] | Japan | 3-167727 |
| Aug. 6, 1991 | [JP] | Japan | 3-221037 |

[51] Int. Cl.$^5$ .................. G02F 1/39; H04B 10/00; H01S 3/06
[52] U.S. Cl. .................. 359/341; 359/177; 369/106
[58] Field of Search .......... 359/341, 337, 187, 194, 359/177; 369/106, 116; 370/13.1; 375/3.1

[56] References Cited

U.S. PATENT DOCUMENTS

| 3,917,916 | 11/1975 | Ohashi et al. | 375/3.1 |
| 3,974,439 | 8/1976 | Holland | 323/17 |
| 4,531,084 | 7/1985 | Hoffman | 320/39 |
| 4,712,075 | 12/1987 | Snitzer | 359/341 |
| 4,791,632 | 12/1988 | Anderson et al. | 372/31 |
| 4,806,873 | 2/1989 | Nagano | 359/187 |
| 4,963,832 | 10/1990 | Desurvire et al. | 359/341 |
| 4,995,100 | 2/1991 | Stallard et al. | 359/187 |
| 5,017,885 | 5/1991 | Saleh | 359/194 |
| 5,036,519 | 7/1991 | Ema et al. | 372/38 |
| 5,054,876 | 10/1991 | Gross et al. | 359/333 |
| 5,088,095 | 2/1992 | Zirngibl | 372/6 |
| 5,107,362 | 4/1992 | Motoshima et al. | 359/187 |
| 5,162,936 | 11/1992 | Toga et al. | 359/177 |

FOREIGN PATENT DOCUMENTS 223091 10/1990 United Kingdom.

OTHER PUBLICATIONS

Desurvire et al; IEEE Photonics Technol. Lett., vol. 3, No. 5, pp. 453-455, May 1991.

Primary Examiner—Nelson Moskowitz
Attorney, Agent, or Firm—Wolf, Greenfield & Sacks

[57] ABSTRACT

A optical signal from the input terminal 6a is amplified and goes through the optical fiber doped with rare earth. The excitation lights from the excitation light sources 2 and 3 are synthesized at the optical coupler 4 and outputted to the optical fiber doped with rare earth 1 through the optical coupler 5. A part of the light is branched from the optical coupler 11 to optical receiver 14 through the band pass light filter 13. The optical receiver 14 converts the received optical signal to an electrical signal and outputs it to the error signal output circuit 114. The receiving current is amplified in the error signal output circuit 114 and branched to the excitation light source output control circuits 9 and 10. The excitation light source output control circuits 9 and 10 execute feedback control so as to obtain a constant excitation light level outputted to the optical fiber doped with rare earth from the excitation light sources 2 and 3, in response to the output signal of the optical receiving circuits 7 and 8, and the output signal of the error signal branching circuit 115.

22 Claims, 20 Drawing Sheets

OPTICAL FIBER AMPLIFIER AND ITS AMPLIFICATION METHOD

BACKGROUND OF THE INVENTION

The invention relates to an optical fiber amplifier and its amplification method, more particularly to an automatic gain control of an optical fiber amplifier using a rare earth doped optical fiber in the optical communication system.

FIG. 19 is a conventional optical fiber amplifier shown in the preliminary report C-281, "light soliton amplification and propagation using Er doped optical fiber", of the national meeting in autumn, the Institute of Electronics, Information and Communication Engineers, 1989, pp4-221. In FIG. 19, 1 is an optical fiber doped with rare earth. 2 is an excitation light source. 3 is a excitation light source. 4 and 5 are optical couplers. 6a is an input terminal of the optical signal. 6b is an output terminal of the optical signal.

An operation of the conventional optical fiber amplifier shown in FIG. 19 is explained hereinafter. In FIG. 19, the optical fiber doped with rare earth 1 is fabricated by doping the rare earth element erbium (Er) into a single mode fiber having the length of around several meters to several tens of meters. The optical fiber doped with rare earth 1 is connected to the optical coupler 5. The excitation light sources 2 and 3 comprise, for example, a semiconductor laser having a wavelength of 1.48 $\mu$m.

The output lights from the excitation light sources 2 and 3 are synthesized to one light beam and inputted to the optical fiber doped with rare earth 1 through the optical coupler 5. When the excitation light sources 2 and 3 are inputted to the optical fiber doped with rare earth 1 through the optical coupler 5, the optical fiber doped with rare earth 1 changes to the state of inverted population. In the inverted population state, a optical signal having a wavelength of 1.53 $\mu$m or 1.55 $\mu$m inputted from the input terminal 1 is amplified by the stimulated emission effect and outputted to the output terminal 6b.

FIG. 20 shows the relation between excitation light source input power and optical signal output power. FIG. 21 shows the relation between optical signal input power and optical signal output power.

The conventional optical fiber amplifier shown in FIG. 19 has no control system to the output optical signal. Accordingly the output optical signal level easily varies according to the variations of the input optical signal, the output light of the excitation light source, the wavelength, the optical fiber doped with rare earth and the loss of the loptical coupler. If the optical communication system is constructed using the above conventional optical fiber amplifier, since the dynamic range required for each apparatus in the system is enlarged, an operational stability of the system is difficult to attain and the construction cost increases.

It is a primary object of the present invention to provide an optical fiber amplifier and a fiber amplification method, where the output optical signal level is maintained stable if the input optical signal, the output light of the excitation light source, the wavelength, the loss of the optical fiber doped with rare earth and the optical coupler varies, and stable operation is obtained if the optical fiber system has a plurality of excitation light sources.

SUMMARY OF THE INVENTION

An optical fiber amplifier, having an optical fiber doped with rare earth for amplifying the light and a plurality of excitation light sources for exciting the soptical signal transmitting through the optical fiber, comprises a plurality of excitation light source control circuits for controlling the output signal of the excitation light sources in order to obtain a constant optical fiber output; an error signal output circuit for outputting a difference error signal between an electrical signal level corresponding to the output optical signal from the optical fiber doped with rare earth and a reference signal level; an error signal branching circuit for branching the error signal received from the error signal output circuit to the respective excitation light source control circuit and for feeding back the branched error signals to the excitation light source control circuits as reference signals.

DETAILED DESCRIPTION OF THE PREFERRED EMBODIMENTS

Figure 1:
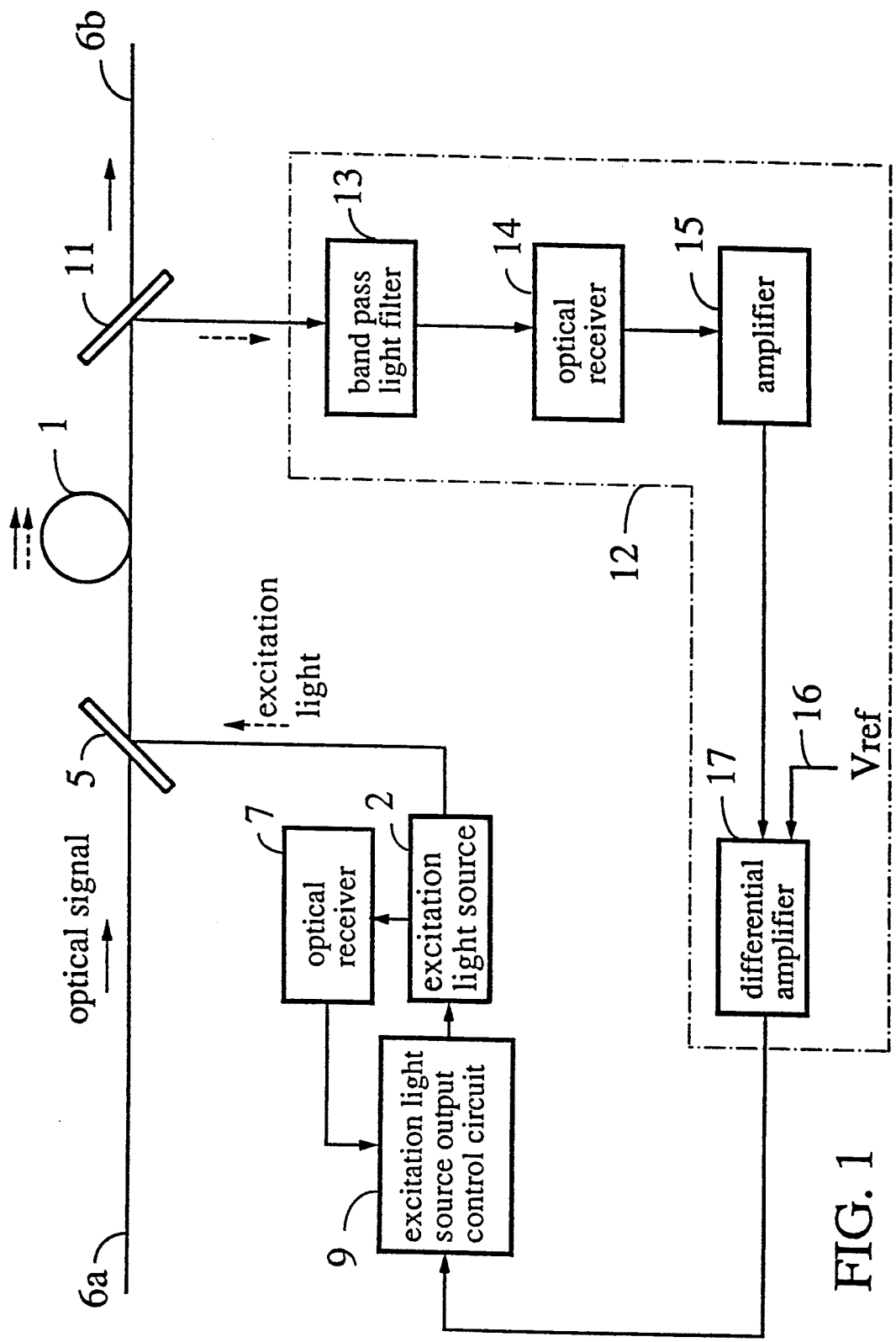
FIG. 1 is a block diagram of an optical fiber amplifier of the first embodiment of the present invention.

FIG. 1 is a block diagram of an optical fiber amplifier of the first embodiment of the present invention.

Figure 7:
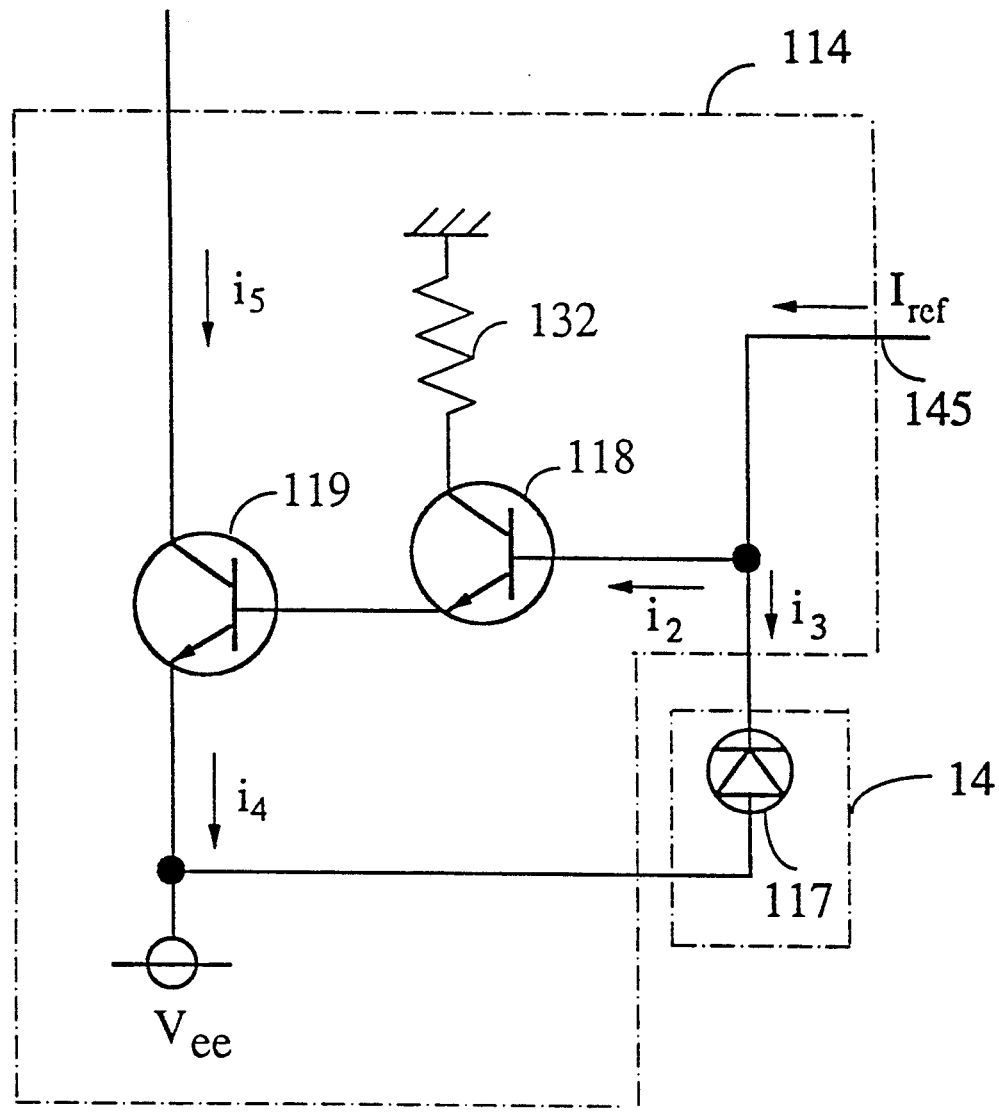
FIG. 7 is a block diagram of a detailed construction of the error signal output circuit 114 in FIG. 6.
Figure 19:
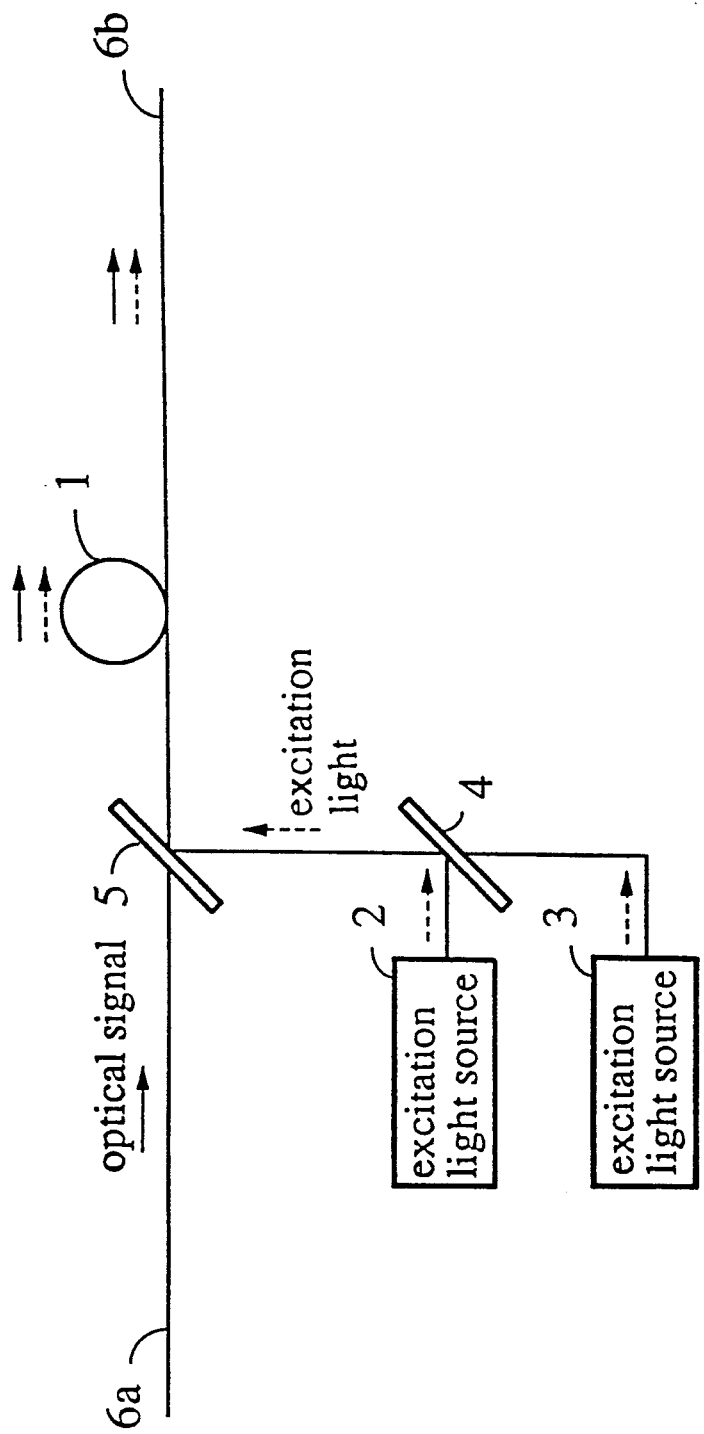
FIG. 19 is a block diagram of a conventional optical fiber amplifier.

In FIGS. 1, 7 is an optical receiver. 9 is an excitation light source control circuit. 11 is an optical coupler. 12 is a light detector. 13 is a band pass light filter. 14 is an optical receiver. 15 is an amplifier. 16 is a reference voltage. 17 is a differential amplifier. The light detector 12 includes the band pass light filter 13, the optical receiver 14, the amplifier 15, the reference voltage 16 and the differential amplifier 17. The bandpass light filter 13 includes, for example, a multi layer dielectric, which causes the optical signal having a wavelength of 1.53 μm and 1.55 μm to pass and the excitation light having a wavelength of 1.48 μm to prevent to pass. Other reference numbers in FIG. 1 are the same as those used for the same portions or the corresponding portions in FIG. 19.

The operation of the optical fiber amplifier of the first embodiment of the present invention shown in FIG. 1 is explained hereinafter. The excitation light from the excitation light source 2 is inputted to the optical fiber doped with rare earth 1 through the optical coupler 5. On the other hand, the optical signal from the input terminal 6a is inputted to the optical fiber doped with rare earth 1 through the optical coupler 5 and amplified.

Figure 20:
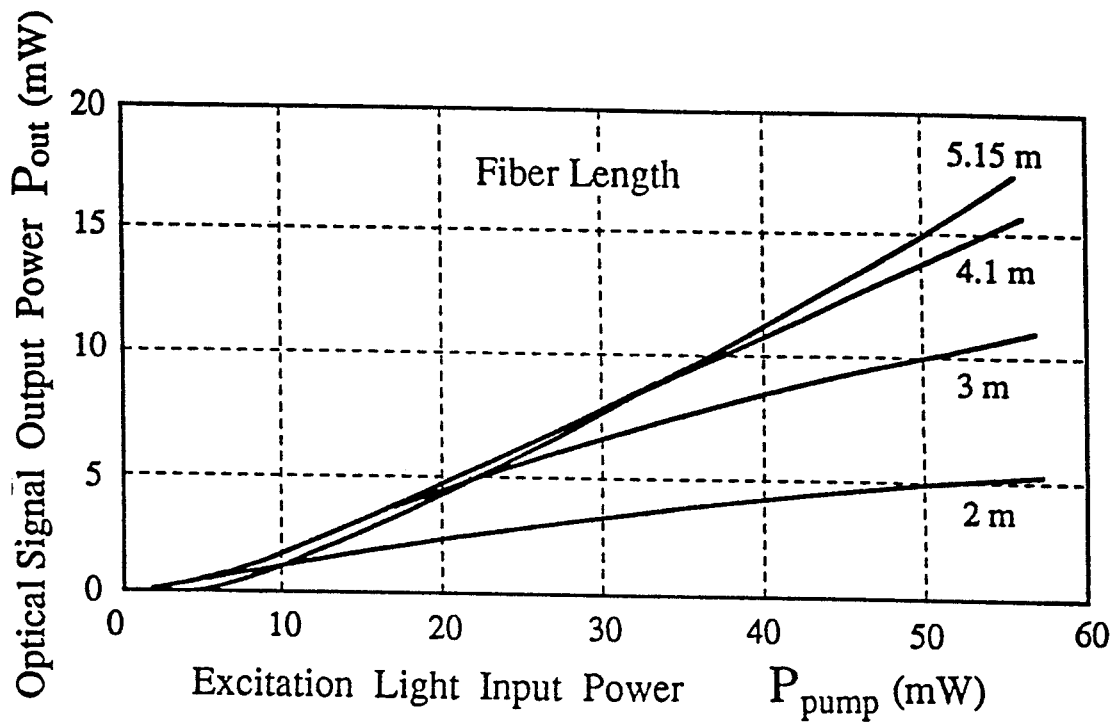
FIG. 20 shows a relation between excitation light source input power and optical signal output power.

A part of the amplified optical signal is branched by the optical coupler 11 together with the excitation light and inputted to the band pass light filter 13. The bandpass light filter 13 prevents the excitation light having a wavelength of 1.48 μm to pass and causes the optical signal having a wavelength of 1.53 μm and 1.55 μm to pass to the optical receiver 14. The optical receiver 14 converts the received optical signal to an electrical signal and outputs it to the amplifier 15. The amplifier 15 amplifies the electrical signal to a predetermined level and outputs it to the differential amplifier 17. The differential amplifier 17 compares the signal from the amplifier 15 with a reference voltage 16 and outputs an error signal to the excitation light source output control circuit 9. The excitation light source output control circuit 9 connected to the excitation light source 2 controls an output of the excitation light source 2 in the feed-back loop in response to the output error signal from the differential amplifier 17. Since the output optical signal outputted from the output terminal 6b is in proportion to the excitation light input power inputted to the optical fiber doped with rare earth 1 as shown in FIG. 20, the optical signal output power can be controlled so as to maintain the constant value by controlling the output power of the excitation light source 2 in the feed-back loop.

In FIG. 1, the first feed-back loop includes the optical receiver 7, the excitation light source output control circuit 9 and the excitation light source 2. The second feed-back loop includes the light output detector 12, the excitation light source output control circuit 9 and the excitation light source 2. The response time constant of the first feed-back loop is selected to be much smaller than that of the second feed-back loop.

When the optical signal inputted to the light output detector 12 maintains a constant level, the output level of the excitation light source 2 is controlled to be a desired constant value by the first feed-back loop. Therefore, the variation of the threshold current and differential quantization efficiency are absorbed if the output of the excitation light sources 2 varies by the ambient temperature variation. And the output level of the excitation light sources 2 is maintained constant.

When the optical signal level inputted to the light output detector 12 varies in response to the variation of the input optical signal level inputted to the input terminal 6a, the wavelength of the excitation light source and the loss of the optical fiber doped with rare earth 1 and the optical coupler 5 and 11, the output error signal of the light output detector 12 varies in the second feed-back loop. The output error signal of the light output detector 12 controls the output optical signal levels generated from the excitation light sources 2 through the second feed-back loop. As a result, the optical signal output from the output terminal 6b is maintained at a desired constant value.

Figure 2:
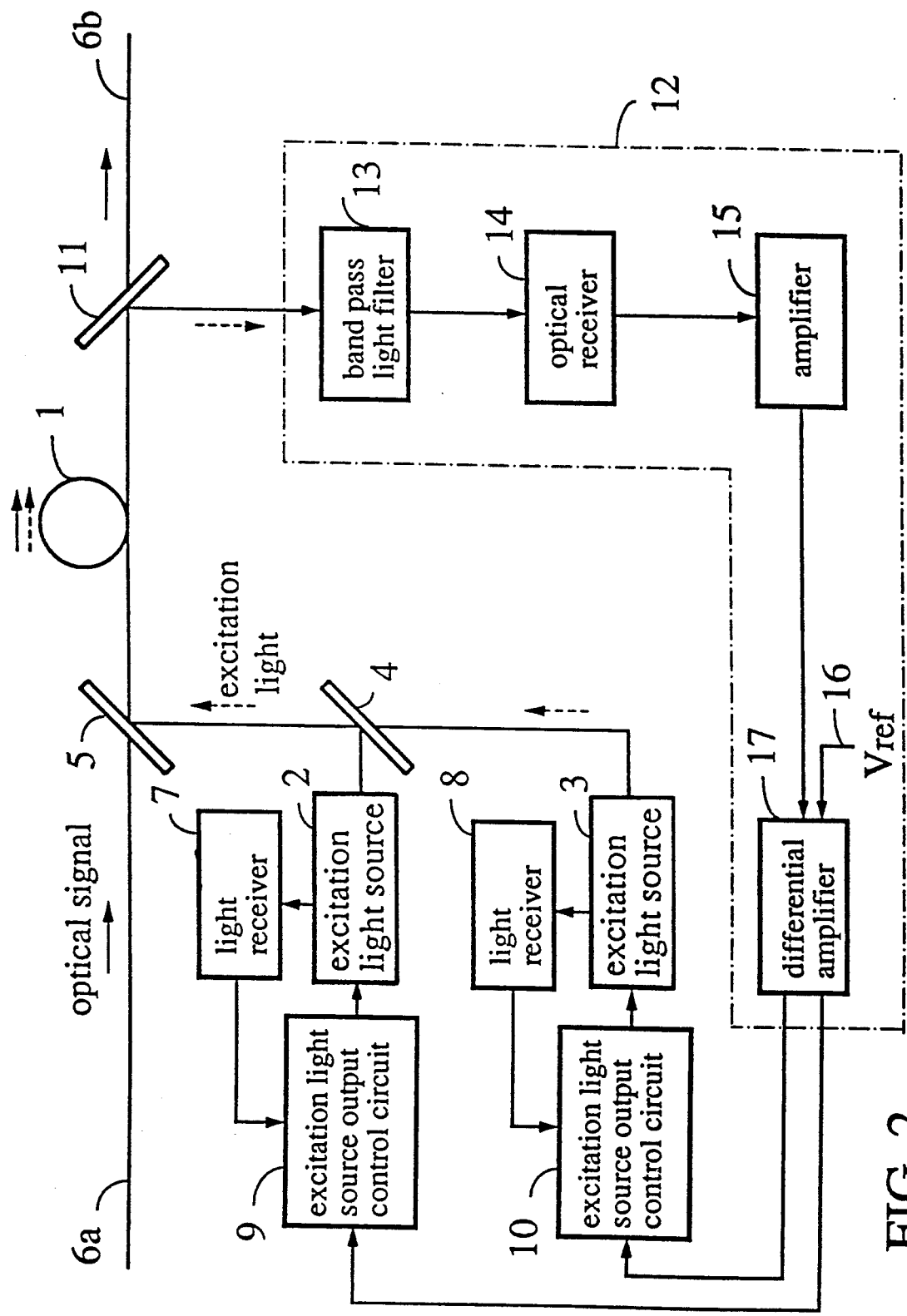
FIG. 2 is a block diagram of an optical fiber amplifier of the second embodiment of the present invention.

FIG. 2 is a block diagram of an optical fiber amplifier of the second embodiment of the present invention.

Figure 8:
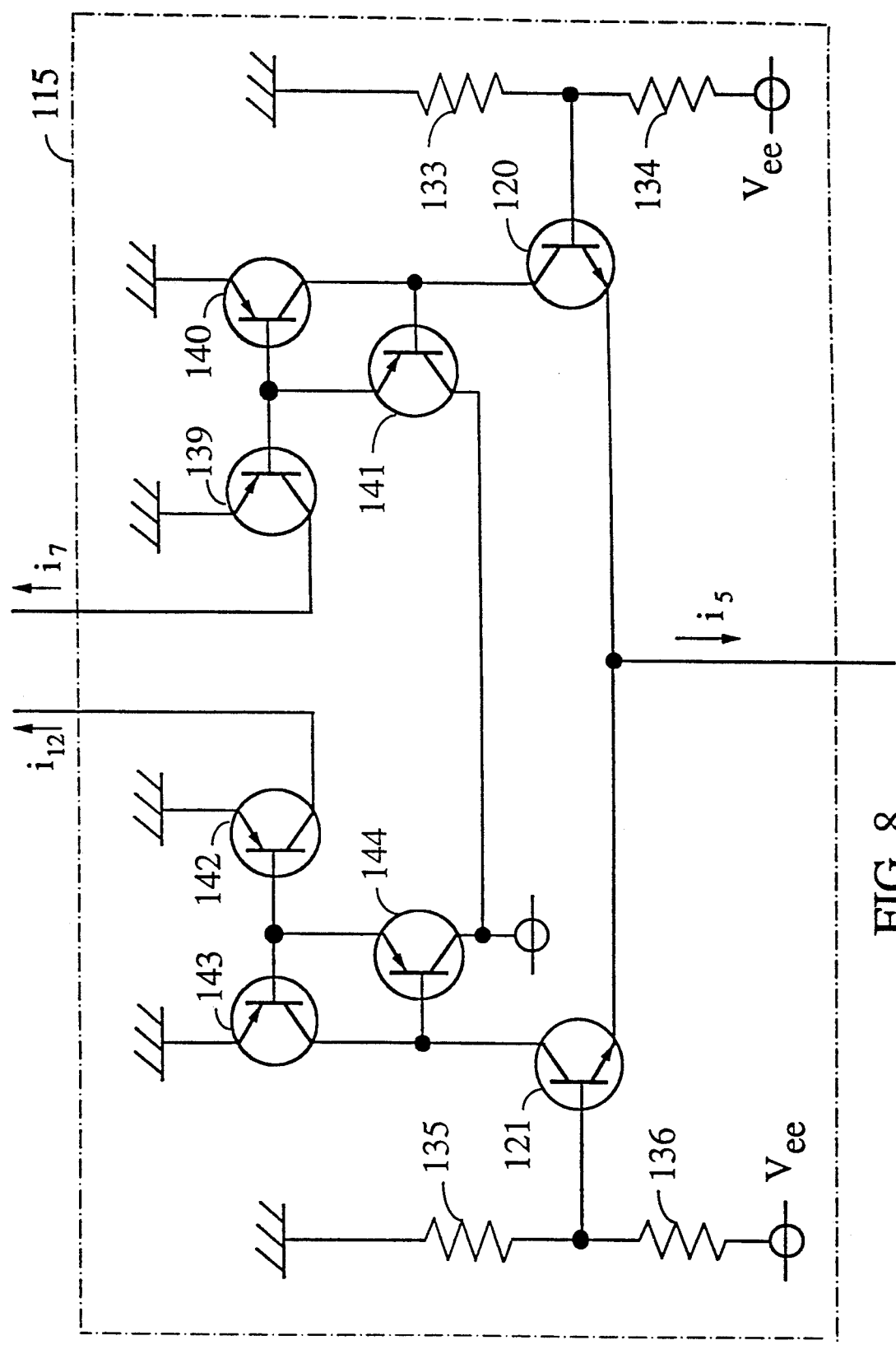
FIG. 8 is a block diagram of a detailed construction of the error signal branching circuit 115.

In FIG. 2, 7 and 8 are optical receivers. 9 and 10 are excitation light source control circuits. 11 is an optical coupler. 12 is a light detector. 13 is a band pass light filter. 15 is an amplifier. 16 is a reference voltage. 17 is a differential amplifier. The light detector 12 includes the band pass light filter 13, the optical receiver 14, the amplifier 15, the reference voltage 16 and the differential amplifier 17. The bandpass light filter 13 includes, for example, a multi layer dielectric, which causes the optical signal having a wavelength of 1.53 μm and 1.55 μm to pass and the excitation light having a wavelength of 1.48 μm to prevent to pass. Other reference numbers in FIG. 2 are the same as those used for the same portions or the corresponding portions in FIG. 19.

The operation of the optical fiber amplifier of the second embodiment of the present invention shown in FIG. 2 is explained hereinafter. The excitation lights from the excitation light sources 2 and 3 are inputted to the optical fiber doped with rare earth 1 through the optical couplers 4 and 5. On the other hand, the optical signal from the input terminal 6a is inputted to the optical fiber doped with rare earth 1 through the optical coupler 5 and amplified.

A part of the amplified optical signal is branched by the optical coupler 11 together with the excitation light and inputted to the band pass light filter 13. The bandpass light filter 13 prevents the excitation light having a wavelength of 1.48 μm to pass and causes the optical signal having a wavelength of 1.53 μm and 1.55 μm to pass to the optical receiver 14. The optical receiver 14 converts the received optical signal to an electrical signal and outputs it to the amplifier 15. The amplifier 15 amplifies the electrical signal to a predetermined level and outputs it to the differential amplifier 17. The differential amplifier 17 compares the signal from the amplifier 15 with a reference voltage 16 and outputs an error signal to the excitation light source output control circuits 9 and 10. The excitation light source output control circuit 9 connected to the excitation light source 2 and the optical receiver 7 controls an output of the excitation light source 2 in the feed-back loop in response to the output error signal from the differential amplifier 17 and the optical receiver 7. The excitation light source output control circuit 10 connected to the excitation light source 3 and the optical receiver 8 controls an output of the excitation light source 3 in the feed-back loop in response to the output error signal from the differential amplifier 17 and the optical receiver 8. Since the output optical signal outputted from the output terminal 6b is in proportion to the excitation light input power inputted to the optical fiber doped with rare earth 1 as shown in FIG. 20, the optical signal output power can be controlled so as to maintain the constant value by controlling the output power of the excitation light sources 2 and 3 in the feed-back loop.

In FIG. 2, the first feed-back loop includes the optical receivers 7 and 8, the excitation light source output control circuits 9 and 10, and the excitation light sources 2 and 3. The second feed-back loop includes the light output detector 12, the excitation light source output control circuits 9 and 10, and the excitation light sources 2 and 3. The response time constant of the first feed-back loop is selected to be much smaller than that of the second feed-back loop.

When the optical signal inputted to the light output detector 12 maintains a constant level, the output levels of the excitation light source 2 and 3 are controlled to be a desired constant value by the first feed-back loop. Therefore, the variation of the threshold current and differential quantization efficiency are absorbed if the outputs of the excitation light sources 2 and 3 vary by the ambient temperature variation. The output levels of the excitation light sources 2 and 3 are maintained constant.

When the optical signal level inputted to the light output detector 12 varies in response to the variation of the input optical signal level inputted to the input terminal 6a, the wavelength of the excitation light source and the loss of the optical fiber doped with rare earth 1 and the optical coupler 4, 5 and 11, the output error signal of the light output detector 12 varies in the second feed-back loop. The output error signal of the light output detector 12 controls the output optical signal levels generated from the excitation light sources 2 and 3 through the second feed-back loop. As a result, the optical signal output from the output terminal 6b is maintained at a desired constant value.

Figure 3:
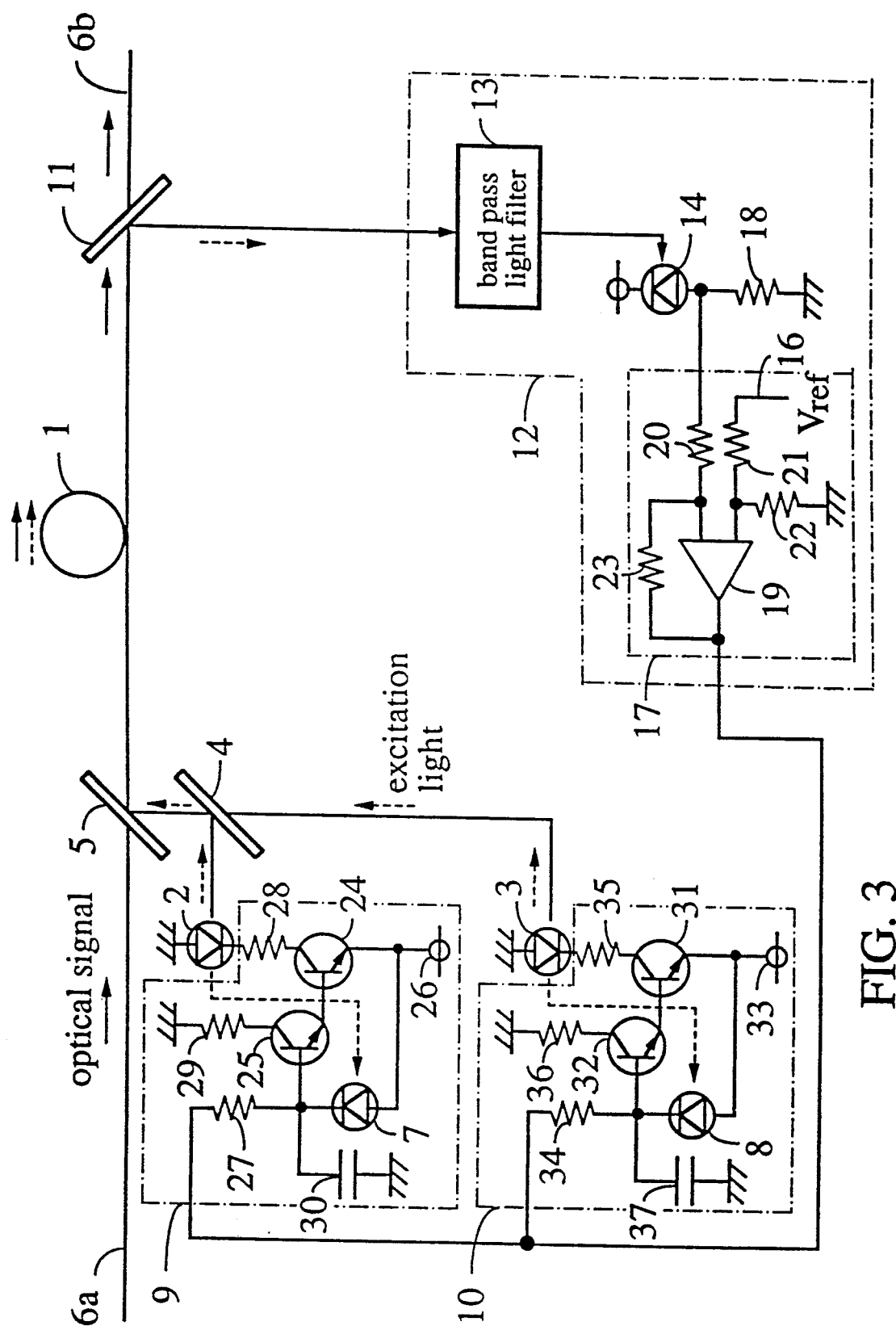
FIG. 3 shows a detailed construction of the second embodiment of the present invention shown in FIG. 2.

FIG. 3 shows a detailed construction of the second embodiment of the present invention shown in FIG. 2. In FIG. 3, more detailed operation of the second embodiment is explained hereinafter. In FIG. 3, 1, 2, 3, 4, 6a, 6b, 7, 8, 9, 10, 11, 12, 13, 14, 15, 16 and 17 are the same as those in FIG. 2. In FIG. 3, 18 is a resistance. 19 is an operational amplifier. 20, 21, 22 and 23 are resistance. 24 and 25 are transistors connected as a darlington pair. 26 is a power source. 27, 28 and 29 are resistances. 30 is a capacitor. 31 and 32 are transistors connected as a darlington pair. 33 is a power source. 34, 35 and 36 are resistances. 37 is a capacitor.

The connection of FIG. 3 is explained hereinafter. The light detector 12 includes the band pass light filter 13, the optical receiver 14, resistances 18, 20, 21, 22, and 23, and an operational amplifier 19. The output optical signal passed through the band pass light filter 13 is converted to a current signal in the optical receiver 14, then converted to a voltage signal at the resistor 18. The voltage signal at the resistor 18 is applied to the differential amplifier comprised the operational amplifier 19, and the resistors 20, 21, 22 and 23 and compared with the reference voltage $V_{ref}$ 16. The differential output of the two input signals is amplified and outputted to the excitation light source output control circuits 9 and 10.

The excitation light source output control circuit 9 includes the transistors 24 and 25, the power source 26, and resistors 27, 28 and 29, and the capacitor 30. The cathode terminal of the excitation light source 2 is connected to one port of the resistor 28 and the anode terminal of it is connected to the earth. The cathode of the optical receiver 7 is connected to the base terminal of the transistor 25 and the anode of it is connected to the power source 26. The capacitor 30 is connected between the base of the transistor 25 and the earth for bypassing the high frequency component. The output signal from the light detector 12 is applied to the base terminal of the transistor 25 through the resistor 27.

The excitation light source output control circuit 10 includes the transistors 31 and 32, the power source 33, resistances 34, 35 and 36, and the capacitor 37. Other connections are similar to those of the excitation light source output control circuit 9, and thus the explanation of the detailed connections are omitted.

An operation of the second embodiment of the present invention is explained using equations. Variables used in the equations are defined as follows.

$P_{in}$: optical signal input level
$P_{out}$: optical signal output level
G: gain of the optical fiber amplifier
$P_{pump}$: excited light level at the input terminal of the optical fiber doped with rare earth 1 (output level of the optical coupler 5)
$P_1$: light output level of the excitation light source 2
$P_2$: light output level of the excitation light source 3
$k_1$: total passing losses through the optical coupler 4 and 5 for the excited light
$k_2$: total losses of branching loss of the optical coupler 11 and passing loss through the bandpass light filter 13 for the optical signal
$S_m$: receiving sensitivity of the optical receiver 14
$R_m$: resistance value of the load resistance 18 for the optical receiver 14
$G_m$: gain of the differential amplifier 17
$\alpha_1$: receiving sensitivity of the light receiver 7
$\alpha_2$: receiving sensitivity of the light receiver 8
$\beta_1$: current amplification factor of the darlington transistor 24, 25
$\beta_2$: current amplification factor of the darlington transsitor 31, 32
$\eta_1$: differential quantization efficiency of the laser diode used for the excitation light source 2
$\eta_2$: differential quantization efficiency of the laser diode used for the excitation light source 3
$i_{l1}$: direct bias current of the laser diode used for the excitation light source 2
$i_{l2}$: direct bias current of the laser diode used for the excitation light source 3
$I_{th1}$: threshold current of the laser diode used for the excitation light source 2
$I_{th2}$: threshold current of the laser diode used for the excitation light source 3
$I_{p1}$: light current of the optical receiver 7 used for the excitation light source 2
$I_{p2}$: light current of the optical receiver 8 used for the excitation light source 3
$V_{be1}$: voltage between the base and the emitter of the darlington transistor 24, 25
$V_{be2}$: voltage between the base and the emitter of the darlington transistor 31, 32
$R_1$: resistance of the resistor 27
$R_2$: resistance of the resistor 34
$V_{ee}$: voltage of the power source 26, 33
$V_0$: output voltage of the light detector 12
$V_{ref}$: reference voltage The output voltage V0 is obtained in the following equation.

$$V_0 = G_m \cdot (S_m \cdot R_m \cdot k_2 \cdot P_{out} - V_{ref}) \quad (1)$$

The light output levels P1 and P2 of the excitation light sources 2 and 3 are obtained in the following equation, respectively.

$$P_1 = \eta_1 \cdot (I_{l1} - I_{th1}) \quad (2)$$

$$P_2 = \eta_2 \cdot (I_{l2} - I_{th2}) \quad (3)$$

Therefore an excited light level $P_{pump}$ at the input terminal of the optical fiber doped with rare earth 1 is obtained as follows.

$$P_{pump} = K_1 \cdot (P_1 + P_2) \quad (4)$$

The light output levels Ip1 and Ip2 of the optical receivers 7 and 8 are obtained as follows, respectively $$I_{p1} = \alpha_1 \cdot P_1 \quad (5)$$

$$I_{p2} = \alpha_1 \cdot P_2 \quad (6)$$

In the direct current equivalent circuits of the excitation light source output control circuits 9 and 10, the following equations are obtained.

$$V_{ee} = V_0 + V_{be1} + R_1 \cdot (I_{l1}/\beta_1 + I_{p1}) \quad (7)$$

$$V_{ee} = V_0 + V_{be2} + R_2 \cdot (I_{l2}/\beta_2 + I_{p1}) \quad (8)$$

From the equation (2) to equation (8), the light output levels P1 and P2 of the laser diodes used for the excitation light sources 2 and 3 are obtained as follows.

$$P_1 = \gamma_1 \cdot \{(V_{ee} - V_{be1})/R_1 - I_{th1}/\beta_1\} - V_0 \gamma_1 / R_1 \quad (9)$$

$$P_2 = \gamma_2 \cdot \{(V_{ee} - V_{be2})/R_2 - I_{th2}/\beta_2\} - V_0 \gamma_2 / R_2 \quad (10)$$

But, $$\gamma_1 = 1/[\alpha_1 \cdot \{1 + 1/(\alpha_1 \cdot \beta_1 \cdot \eta_1)\}] \quad (11)$$

$$\gamma_2 = 1/[\alpha_2 \cdot \{1 + 1/(\alpha_2 \cdot \beta_2 \cdot \eta_2)\}] \quad (12)$$

Accordingly, the excited light level $P_{pump}$ at the input terminal of the optical fiber doped with rare earth 1 is obtained as follows.

$$\begin{aligned} P_{pump} &= A - B \cdot V_0 \\ &= A - B \cdot G_m \cdot (S_m \cdot R_m \cdot k_2 \cdot P_{out} - V_{ref}) \end{aligned} \quad (13)$$

But, $$A = k_1 \cdot [\gamma_1 \cdot \{(V_{ee} - V_{be1})/R_1 - I_{th1}/\beta_1\} + \gamma_2 \cdot \{(V_{ee} - V_{be2})/R_2 - I_{th2}/\beta_2\}] \quad (14)$$

$$B = k_1 \cdot (\gamma_1/R_1 + \gamma_2/R_2) \quad (15)$$

Figure 21:
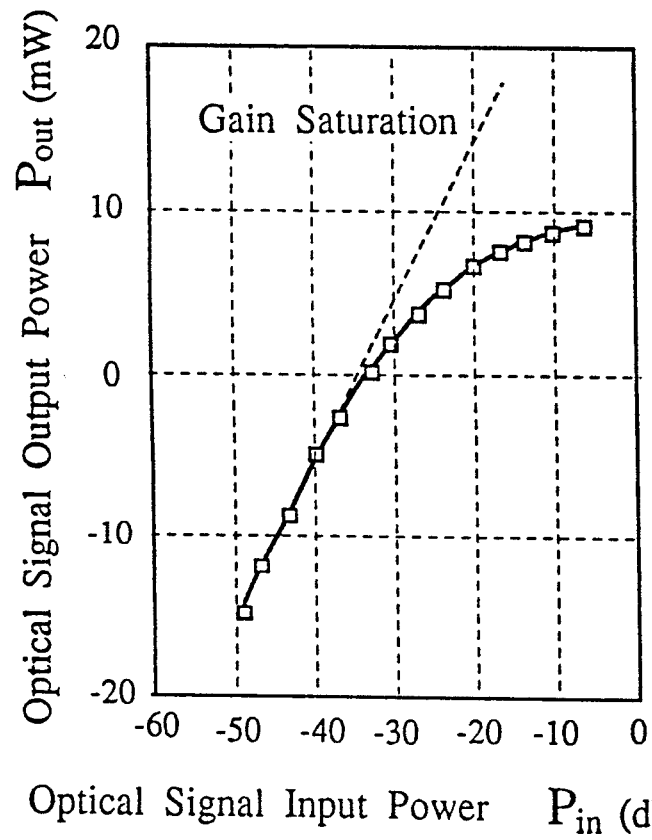
FIG. 21 shows a relation between optical signal input power and optical signal output power.

Since the optical signal output level $P_{out}$ relates to the excitation light input level $P_{pump}$ and the optical signal input level $P_{in}$ as shown in FIG. 20 and FIG. 21, respectively, the relation of $P_{pump}$ and $P_{in}$ is obtained in the following equation if the fiber length of the optical fiber doped with rare earth 1 is fixed.

$$P_{out} = G_0(P_{in}) \cdot P_{pump} \cdot P_{in} \quad (16)$$

Where, $G_0(P_{in}) \cdot P_{pump}$ is a gain of the optical fiber amplifier, and $G_0$ is a function of the optical signal input level $P_{in}$. From the equations (13) and (16), the optical signal output level $P_{out}$ is finally obtained as follows.

$$P_{out} = G_0 \cdot P_{in} \cdot (A + B \cdot G_m \cdot V_{ref})/(1 + B \cdot G_m \cdot k_2 \cdot S_m \cdot R_m \cdot G_0 \cdot P_{in}) \quad (17)$$

In the equation (17), especially,
In the case of $$B \cdot G_m \cdot k_2 \cdot S_m \cdot R_m \cdot G_0 \cdot P_{in} \gg 1 \quad (18)$$

$P_{out}$ has no relation with $G_0$ and $P_{in}$ as shown in the following equation.

$$P_{out} = (A + B \cdot G_m \cdot V_{ref})/B \cdot G_m \cdot k_2 \cdot S_m \cdot R_m \quad (19)$$

In the equation 11 and 12, $$\alpha_1 \cdot \beta_1 \cdot \eta_1 \gg 1 \quad (20)$$

$$\alpha_2 \cdot \beta_2 \cdot \eta_2 \gg 1 \quad (21)$$

In equation 14 and 15, $$V_{ee}/R_1 \gg V_{be1}/R_1 + I_{th1}/\beta_1 \quad (22)$$

When the following condition is satisfied, $$V_{ee}/R_2 \gg V_{be2}/R_2 + I_{th2}/\beta_2 \quad (23)$$

The equation 19 is abbreviated as follows.

$$P_{out} = (V_{ee} + G_m \cdot V_{ref})/(G_m \cdot k_2 \cdot S_m \cdot R_m) \quad (24)$$

From the above equation it is easily understood that the optical signal output level $P_{out}$ is controlled to be constant in spite of the parameters of optical signal input level $P_{in}$ and the laser diode used for excitation light sources 2 and 3, and the parameters of the excitation light source output Embodiment 3

Figure 4:
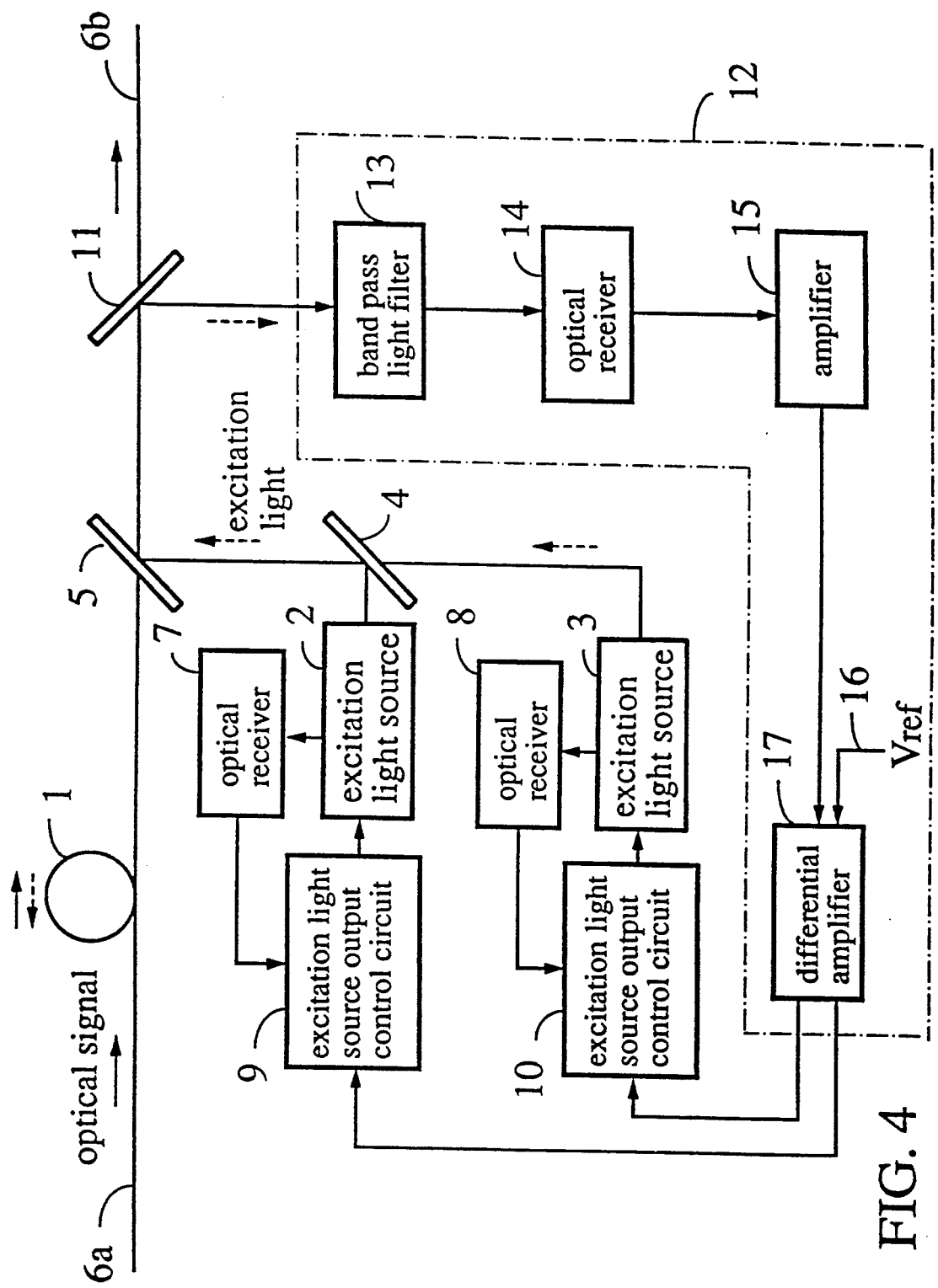
FIG. 4 is a block diagram of an optical fiber amplifier of the third embodiment of the present invention.

FIG. 4 is a block diagram of an optical fiber amplifier of the third embodiment of the present invention. 1~17 in FIG. 1 are the same as those in FIG. 2. In the present embodiment, the operation of the circuit is the same as that of FIG. 2. The only difference from FIG. 2 is in that the direction of excitation light inputted from the loptical coupler 5 to the optical fiber doped with rare earth 1 is inverted for the optical signal.

Embodiment 4

Figure 5:
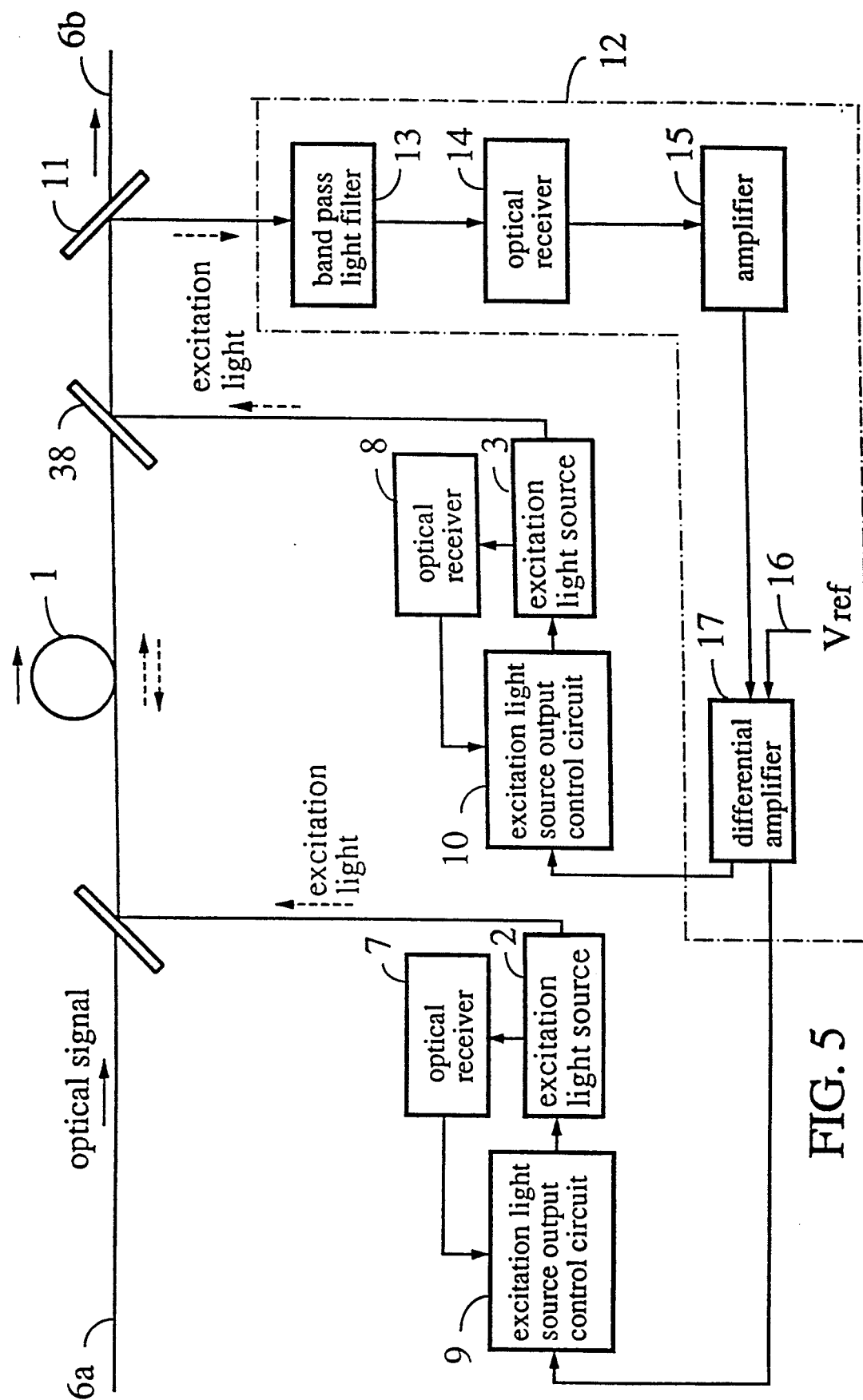
FIG. 5 is a block diagram of an optical fiber amplifier of the fourth embodiment of the present invention.

FIG. 5 is a block diagram of an optical fiber amplifier of the fourth embodiment of the present invention. 1~17 in FIG. 1 are the same as those in FIG. 2. 38 is an optical coupler. In the present embodiment, the operation of the circuit is the same as that of FIG. 2 and FIG. 4. The only difference from FIG. 2 and FIG. 4 is in that the excitation lights are inputted to the input terminal and the output terminal of the optical fiber doped with rare earth 1 from the optical coupler 5 and from the optical coupler 38, respectively.

In the above embodiment, one or two excitation light source are supplied to the circuit, but a plurality of excitation light sources can be supplied to the circuit in a similar manner for obtaining similar functions.

Embodiment 5

Figure 6:
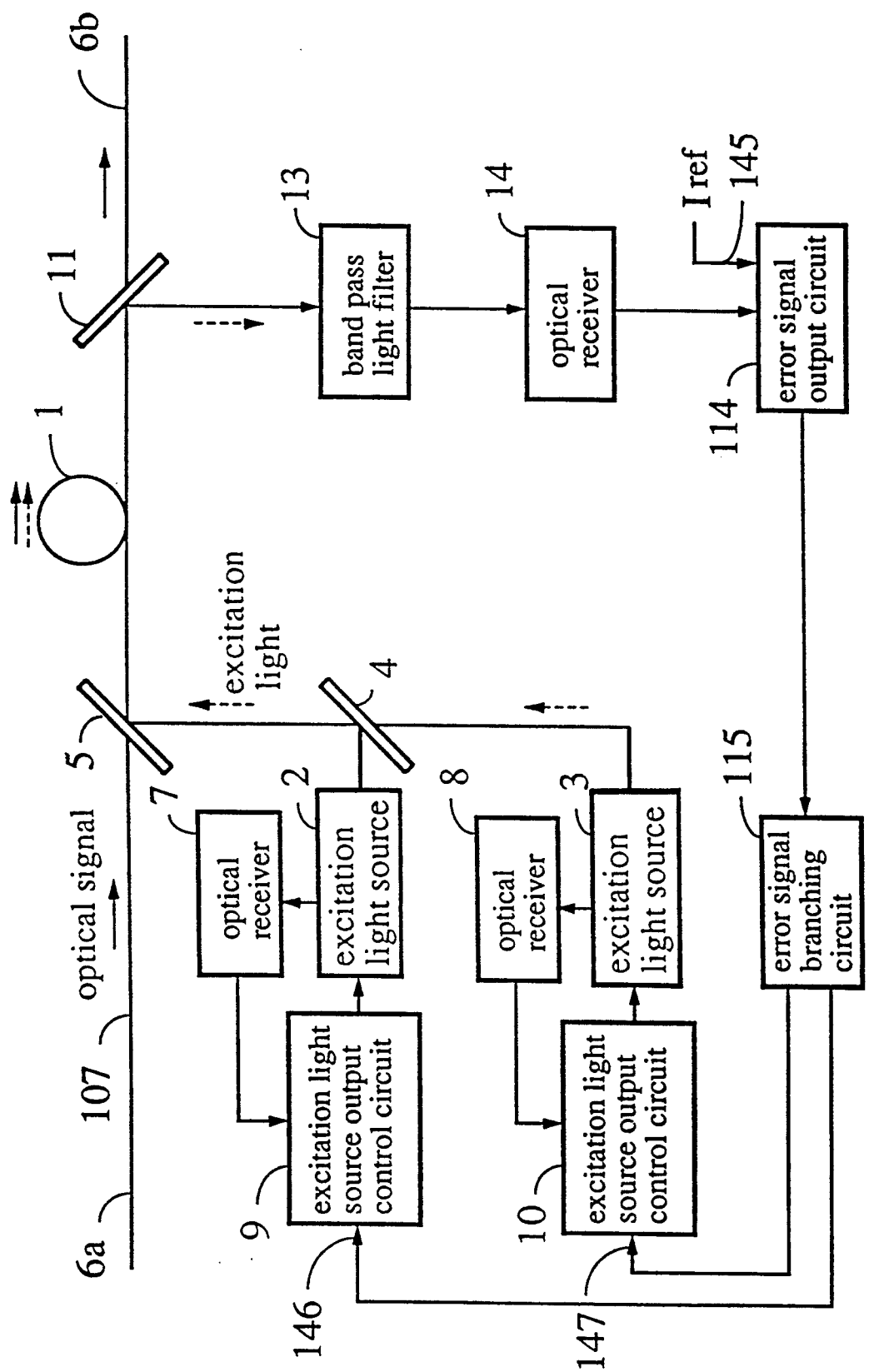
FIG. 6 is a block diagram of an optical fiber amplifier of the fifth embodiment of the present invention.

FIG. 6 is a block diagram of an optical fiber amplifier of the fifth embodiment of the present invention. The components in FIG. 6 are identical or comparable to those referred to by the same symbols in FIG. 19 and their explanation will be omitted. In FIGS. 6, 7 and 8 are optical receivers for converting a part of the output light from the excitation light sources 2 and 3 to electrical signals, respectively. 9 and 10 are excitation light source control circuits for receiving a part of the output signals of the excitation light sources 2 and 3 and for controlling the output light from the excitation light sources 2 and 3 in the feed-back loop, respectively. 11 is an optical coupler for branching an amplified output optical signal received from the optical fiber doped with rare earth 1. 13 is a band pass light filter which prevents the excitation light having a wavelength of 1.48 μm to pass and causes the optical signal having a wavelength of 1.53 μm or 1.55 μm to pass to an optical receiver 12. 14 is an optical receiver for converting the light received from the band pass light filter 13 to an electrical signal. 114 is an error signal output circuit for outputting a difference between the electrical signal level corresponding to the output optical signal of the optical fiber doped with rare earth 1 (the output level of the optical receiver 14) and the reference signal. 115 is an error signal branching circuit which branches the error signal and outputting branched signals to the excitation light source control circuits 9 and 10, respectively, for controlling the excitation light sources 2 and 3 in the feed-back loops. 145 is an input terminal for the reference current. 146 and 147 are input terminals for the reference currents corresponding to the excitation light source control circuits 9 and 10, respectively.

FIG. 7 is a detailed construction of the error signal output circuit 114. In FIG. 2, the optical receiver 14 comprises an optical receiving element 117 which receives and converts the output light from the band pass light filter 13 in FIG. 6 to an electric signal. The error signal output circuit 114 comprises transistors 118 and 119, and a resistor 132. The transistor 118 and the transistor 119 comprises a darlington current amplification circuit. The reference current input terminal 145 is connected to the base terminal of the transistor 118 and connected to the cathode terminal of the optical receiving element 117. The reference current on the reference current input terminal 145 is applied to the base terminal of the transistor 118.

FIG. 8 is a detailed construction of the error signal branching circuit 115. The error signal branching circuit 115 comprises transistors 120 and 121, resistors 139~144 and resistors 133~136 used for the current mirror circuit. The transistors 120 and 121, and the resistors 133~136 construct the differential amplification circuit.

Figure 9:
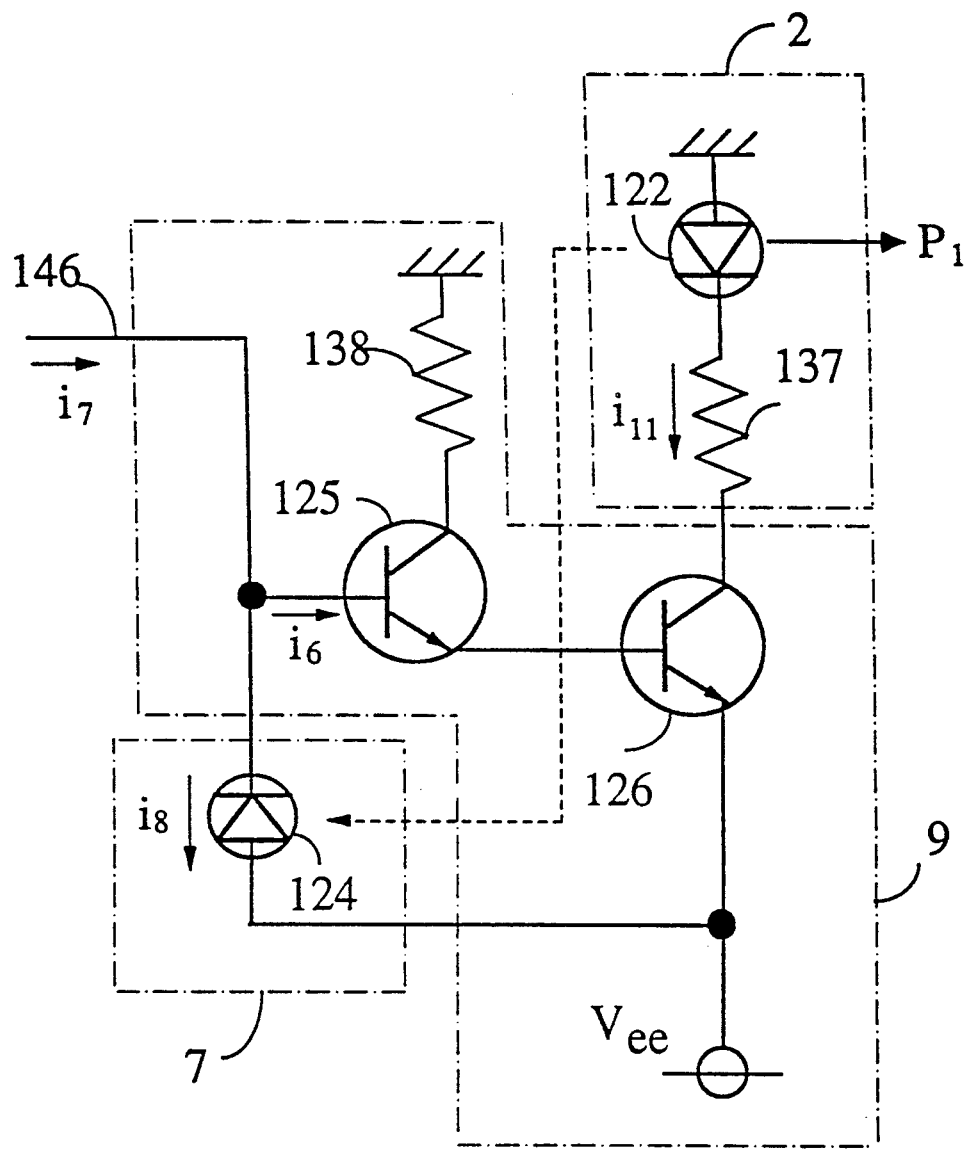
FIG. 9 is a block diagram of a detailed construction of the excitation light source control circuits 9.

FIG. 9 is a detailed construction of the excitation light source control circuit 9. In FIG. 9, the optical receiver 7 comprises an optical receiving element 124. The excitation light sources 2 comprises a laser diode 122 and a resistor 137. The excitation light source control circuit 9 comprises transistors 125 and 126, and a resistor 138. The transistor 125 and the transistor 126 comprises a darlington current amplification circuit. Input terminal 146 is connected to the base terminal of the transistor 125 and connected to the cathode terminal of the optical receiving element 124. The reference current on the reference current input terminal 146 is applied to the base terminal of the transistor 125. The collector terminal of the transistor 126 is connected to the excitation light source 2.

Figure 10:
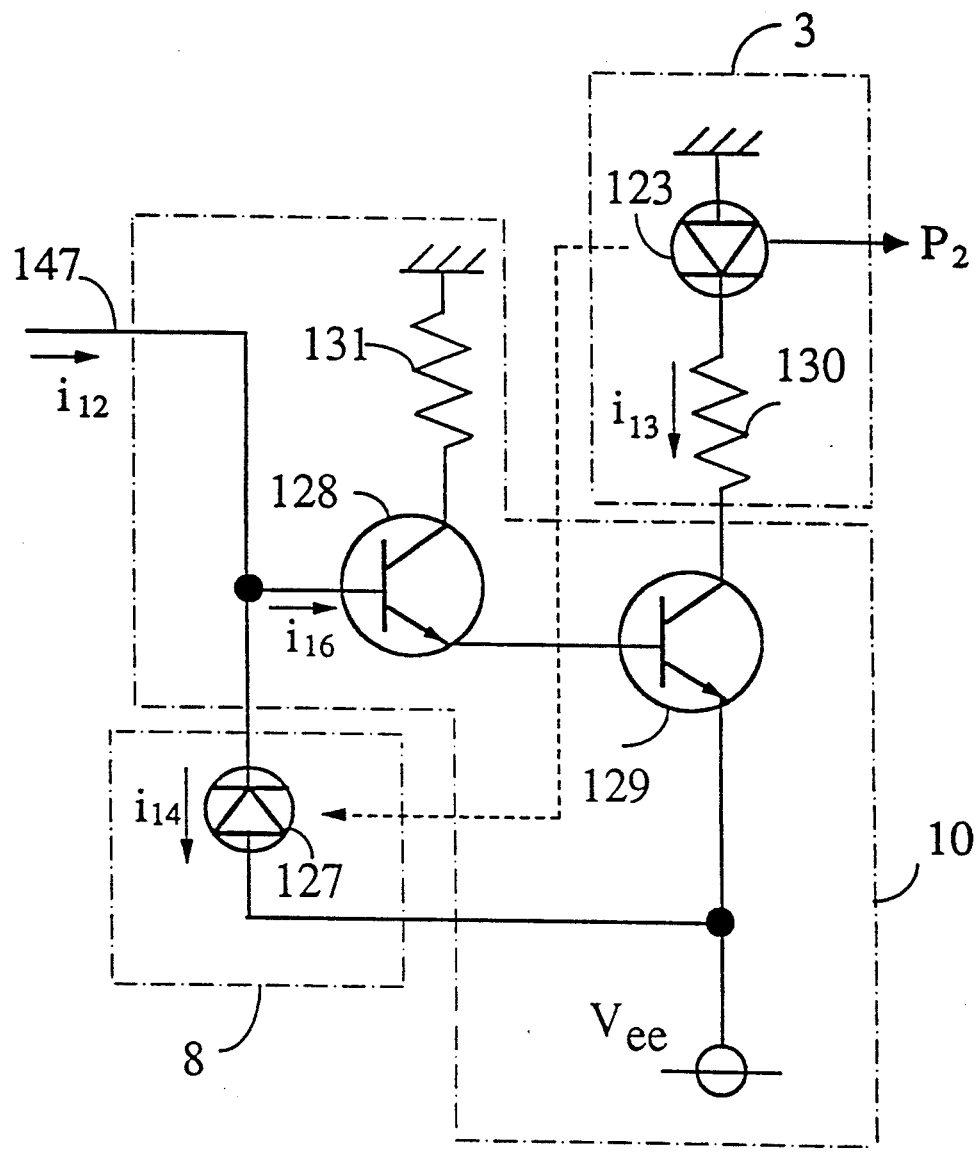
FIG. 10 is a block diagram of the excitation light source control circuits 10.

FIG. 10 is a detailed construction of the excitation light source control circuit 10. In FIG. 10, the optical receiver 8 comprises an optical receiving element 127. The excitation light source 3 comprises a laser diode 123 and a resistor 130. The excitation light source control circuit 10 comprises transistors 128 and 129, and a resistor 131. The transistor 128 and the transistor 129 comprises a darlington current amplification circuit. Input terminal 147 is connected to the base terminal of the transistor 128 and connected to the cathode terminal of the optical receiving element 127. The reference current on the reference current input terminal 147 is applied to the base terminal of the transistor 128. The collector terminal of the transistor 129 is connected to the excitation light source 3.

The operation of the optical fiber amplifier of the fifth embodiment of the present invention shown in FIG. 6 to FIG. 10 is explained hereinafter. The excitation light from the excitation light sources 2 and 3 are inputted to the optical fiber doped with rare earth 1 through the optical coupler 5. On the other hand, the optical signal from the input terminal 6a is inputted to the optical fiber doped with rare earth 1 through the optical coupler 5 and amplified.

A part of the amplified optical signal is branched by the optical coupler 11 together with the excitation light and inputted to the band pass light filter 13. The band-pass light filter 13 prevents the excitation light having a wavelength of 1.48 μm to pass and causes the optical signal having a wavelength of 1.53 μm or 1.55 μm to pass to the optical receiver 14. The optical receiver 14 converts the received optical signal to an electrical signal and outputs it to the error signal output circuit 114. The error signal output circuit 114 compares the electrical signal received from the optical receiver 14 with a reference current Iref and amplifies the resultant signal to a desired level and outputs it to the error signal branching circuit 115. The error signal branching circuit 115 branches the signal received from the error signal output circuit 114 to the excitation light source output control circuits 9 and 10. The excitation light source output control circuit 9, connected to the excitation light source 2 and the optical receiver 7 which receives a part of the output light of the excitation light source 2, controls an output of the excitation light source 2 in the feed-back loop in response to the output error signal from the error signal branching circuit 115. The excitation light source output control circuit 10, connected to the excitation light source 3 and the optical receiver 8 which receives a part of the output light of the excitation light source 3, controls an output of the excitation light source 3 in the feed-back loop in response to the output error signal from the error signal branching circuit 115. Since the output optical signal outputted from the output terminal 6b is in proportion to the excitation light input power inputted to the optical fiber doped with rare earth 1 as shown in FIG. 20, the optical signal output power can be controlled so as to maintain a constant value by controlling the output power of the excitation light sources 2 and 3 in the feed-back loop.

In FIG. 6, the first feed-back loop includes the optical receiver 7 (or 8), the excitation light source output control circuit 9 ( or 10) and the excitation light source 2 ( or 3). The second feed-back loop includes the optical receiver 14, the error signal output circuit 114, the error signal branching circuit 115, the excitation light source output control circuit 9 ( or 10) and the excitation light source 2 ( or 3). The response time constant of the first feed-back loop is selected to be much smaller than that of the second feed-back loop.

When the optical signal inputted to the band pass light filter 13 maintains a constant level, the output levels of the excitation light sources 2 and 3 are controlled to be desired constant values by the first feed-back loop. Therefore, the variation of the threshold current and differential quantization efficiency are absorbed if the outputs of the excitation light sources 2 and 3 vary by the ambient temperature variation, and the output levels of the excitation light sources 2 and 3 are maintained constant.

When the optical signal level inputted to the band pass light filter 13 varies in response to the variation of the input optical signal level inputted to the input terminal 6a, the wavelength of the excitation light source and the loss of the optical fiber doped with rare earth 1 and the optical couplers 4, 5 and 11, the output error signal of the error signal output circuit 114 varies in the second feed-back loop. Then the output error signal from the error signal output circuit 114 is controlled to be a desired value by controlling the excitation light sources 2 and 3 through the first feed-back loop. As a result, the optical signal output from the output terminal 6b is maintained at a desired constant value. As described above, if the circuit is designed so that the response time constant of the first feed-back loop is selected to be much smaller than that of the second feed-back loop, the amplified output optical signal level can be controlled to be always constant.

FIG. 7 shows a detailed construction of the error signal output circuit 114 in FIG. 6. An operation of the first embodiment of the present invention is explained using formulas. Variables used in the formulas are defined as follows.

Each line current: $i_2$, $i_3$, $i_4$ and $i_5$
$I_{ref}$: reference current
$S_m$: receiving sensitivity of the optical receiver 117
$K_2$: total losses of branching loss of the optical coupler 11 and passing loss through the bandpass light filter 13 for the optical signal
$P_{out}$: optical signal output level
$\beta_3$: current amplification factor of the darlington transistors 118, 119

The following equation is obtained in FIG. 7.

$$i_2 = i_1 - i_3 \tag{25}$$

$$i_1 = I_{ref} \tag{26}$$

$$i_3 = S_m \cdot K_2 \cdot P_{out} \tag{27}$$

$$i_2 = I_{ref} - S_m \cdot K_2 \cdot P_{out} \tag{28}$$

$$\begin{aligned} i_5 &= \beta_3 \cdot i_2 \\ &= \beta_3(I_{ref} - S_m \cdot K_2 \cdot P_{out}) \end{aligned} \tag{29}$$

An operation of the error signal branching circuit 115 is explained using FIG. 8. The error signal branching circuit 115 distributes the error signal received from the error signal output circuit 114 to the excitation light source output control circuits 9 and 10. The transistors 120 and 121 and the resistors 133, 134, 135 and 136 construct a differential amplification circuit. The current $i_{12}$ and $i_7$ can be arbitrarily distributed by setting the emitter voltage of the transistors 120 and 121 and by selecting appropriate resistance values for the resistors 133, 134, 135 and 136.

Assume that a distribution factor be a:b, then, $$a_1 = a/(a+b) \tag{30}$$

$$b_1 = b/(a+b) \tag{31}$$

Then, $$\begin{aligned} i_7 &= a_1 \cdot i_5 \\ &= a_1 \cdot \beta_3(I_{ref} - S_m \cdot K_2 \cdot P_{out}) \end{aligned} \tag{32}$$

$$\begin{aligned} i_{12} &= b_1 \cdot i_5 \\ &= b_1 \cdot \beta_3(I_{ref} - S_m \cdot K_2 \cdot P_{out}) \end{aligned} \tag{33}$$

The output currents $i_7$ and $i_{12}$ are branched as shown in the equations (32) and (33).

An operation of the excitation light source output control circuit 9 is explained using FIG. 9. The excitation light source output control circuit 9 compensates for the variation of the differential quantization efficiency ($\eta_1$) and the threshold current ($I_{th2}$) of the laser diode 122 used for the excitation light source 2.

Assume that parameters be as follows,
$K_3$: coupling loss from the excitation light source 2 to the optical receiver 7
$S_{m1}$: receiving sensitivity of the optical receiver 7
$P_1$: light output level of the excitation light source 3
$\beta_1$: current amplification factor of the darlington transistor 125, 126
$K_4$: coupling loss from the excitation light source 3 to the optical receiver 8
$\kappa$: output branch ratio of the optical coupler 11
$K_1$: total passing loss of optical couplers 4 and 5 for the excitation light
$P_{in}$: optical signal input level
then, from FIG. 9, $$i_6 = i_7 - i_8 \tag{34}$$

$$i_8 = S_{m1} \cdot K_3 \cdot P_{out} \tag{35}$$

$$P_1 = \eta_1(i_{l1} - I_{th1})P_{out} \tag{36}$$

$$i_{l1} = \beta_1 \cdot i_6 \tag{37}$$

From the equation (35), (36) and (37), $i_8$ is obtained as follows.

$$i_8 = S_{m1} \cdot K_3 \cdot \eta_1(\beta_1 \cdot i_6 - I_{th1}) \tag{38}$$

and, $$P_1 = \eta_1(\beta_1 \cdot i_6 - I_{th1}) \tag{39}$$

From the equation (10) and (14), $i_6$ is obtained as follows.

$$i_6 = i_7 - S_{m1} \cdot K_3 \cdot \eta_1(\beta_1 \cdot i_6 - I_{th1}) \tag{40}$$

change the equation, $$i_6 = (i_7 - S_{m1} \cdot K_3 \cdot \eta_1 - I_{th1})/(1 + S_m \cdot K_3 \cdot \eta_1 \cdot \beta_1) \tag{41}$$

Since $\beta_1$ is a sufficiently large number in the darlington connection, $$S_m \cdot K_3 \cdot \eta_1 \cdot \beta_1 \gg 1 \tag{42}$$

Therefore the equation (41) is expressed as follows.

$$i_6 = (i_7 - S_{m1} \cdot K_3 \cdot \eta_1 - I_{th1})/S_m \cdot K_3 \cdot \eta_1 \cdot \beta_1 \quad (43)$$

$P_1$ is obtained by substituting the equation (43) into the equation (39), $$P_1 = i_7/(S_m \cdot K_3) \quad (44)$$

From the equation (44), it is easily understood that $P_1$ is not influenced by $\eta_1$ and $I_{th1}$.

In FIG. 5, in a similar manner, $$P_2 = i_{12}/(S_{m2} \cdot K_4) \quad (45)$$

From the equation (45), it is also easily understood that $P_2$ is not influenced by $\eta_2$ and $I_{th2}$.

Since the optical signal output level $P_{out}$ relates to the excitation light input level $P_{pump}$ and the optical signal input level Pin as shown in FIG. 9 and FIG. 10, respectively, the relation of $P_{pump}$ and Pin is obtained in the following equation if the fiber length of the optical fiber doped with rare earth 1 is fixed.

$$P_{out} = \kappa \cdot G_0 \cdot P_{pump} \cdot P_{in} \quad (46)$$

Where, $G_0 \cdot P_{pump}$ are a gain of the optical fiber amplifier, $G_0$ is a function of the optical signal input level.

The excitation light input $P_{pump}$ is obtained as follows.

$$P_{pump} = K_1(P_1 + P_2) \quad (47)$$

From the equations (32), (33) and (47), an equation (48) is obtained as follows.

$$P_{out} = \kappa \cdot K_1 \cdot G_0 \cdot I_{ref} \beta_3 \cdot A \cdot P_{in}/(1 + \kappa \cdot K_1 \cdot G_0 \cdot S_m \cdot K_2 \cdot \beta_3 \cdot A \cdot P_{in}) \quad (48)$$

But, $$A = a_1/(S_{m1}/K_3) + b_1/(S_{m2}/K_4) \quad (49)$$

Since $\beta_3$ is a sufficiently large number in the darlington connection, $$\kappa \cdot K_1 \cdot G_0 \cdot S_m K_2 \cdot \beta_3 \cdot A \cdot P_{in} \gg 1 \quad (50)$$

$$P_{out} = I_{ref}\{a_1/(S_{m1}/K_3) + b_1/(S_{m2}/K_4)\}/S_m \cdot K_2 \quad (51)$$

Therefore, the optical signal output signal level $P_{out}$ has no relation with the optical signal input level $P_{in}$. From the equation (51), it is easily understood that dispersions of $S_{m1}$, $K_3$, $S_{m2}$, $K_4$ is compensated by satisfying the branching ratio (a:b) described in FIG. 8 as follows.

$$a_1/(S_{m1}/K_3) = b_1/(S_{m2}/K_4)\} \quad (52)$$

Embodiment 6

Figure 11:
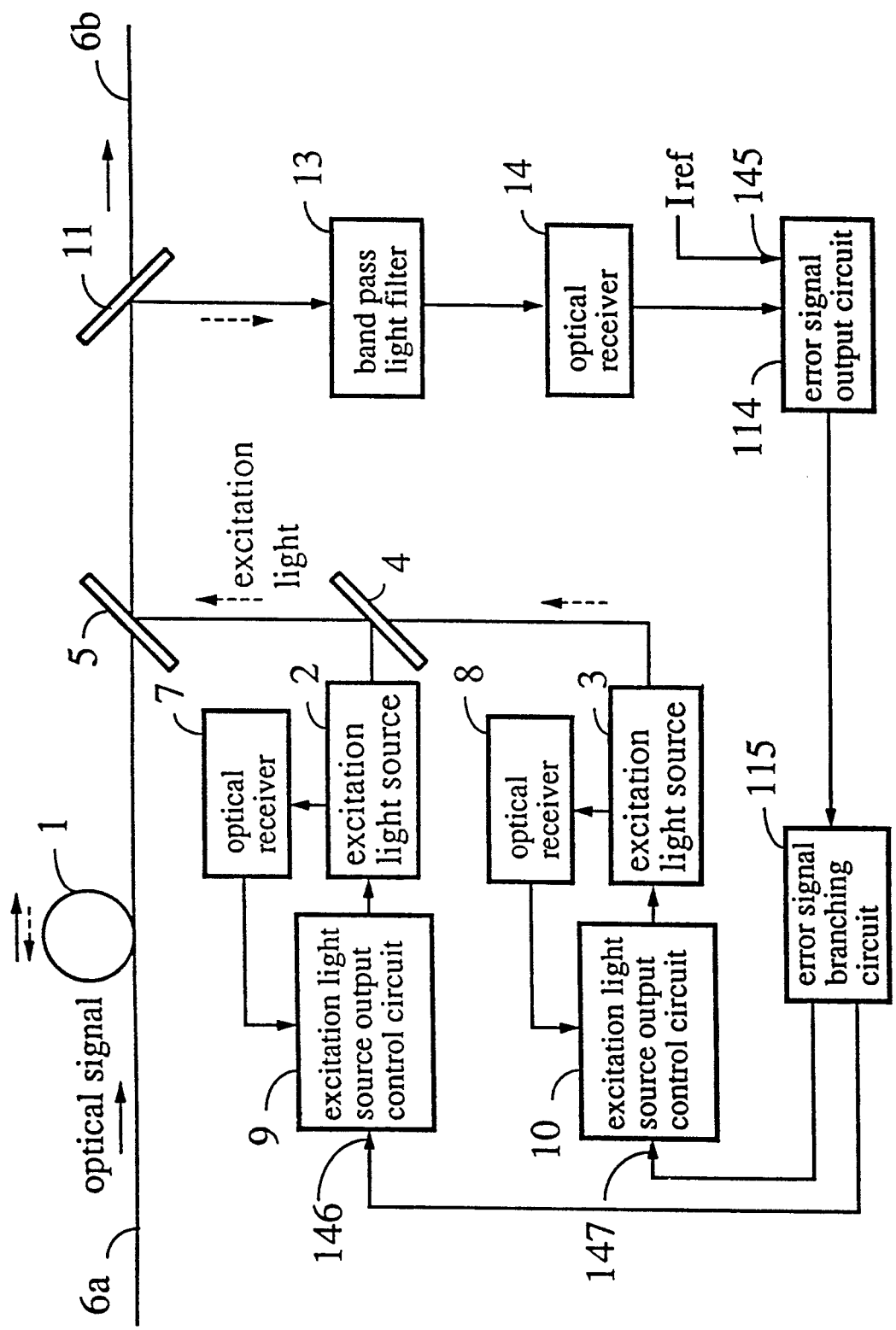
FIG. 11 is a block diagram of an optical fiber amplifier of the sixth embodiment of the present invention.

FIG. 11 is a block diagram of an optical fiber amplifier of the sixth embodiment of the present invention. These components referred to by the same numbers in FIG. 11 are identical or comparable to those referred to by the same numbers in FIG. 6 and their explanation will be omitted. In the sixth embodiment, the operation of the circuit is the same as that of FIG. 6. The only difference from FIG. 6 is in that the direction of excitation light inputted from the optical coupler 5 to the optical fiber doped with rare earth 1 is inverted for the optical signal.

Embodiment 7

Figure 12:
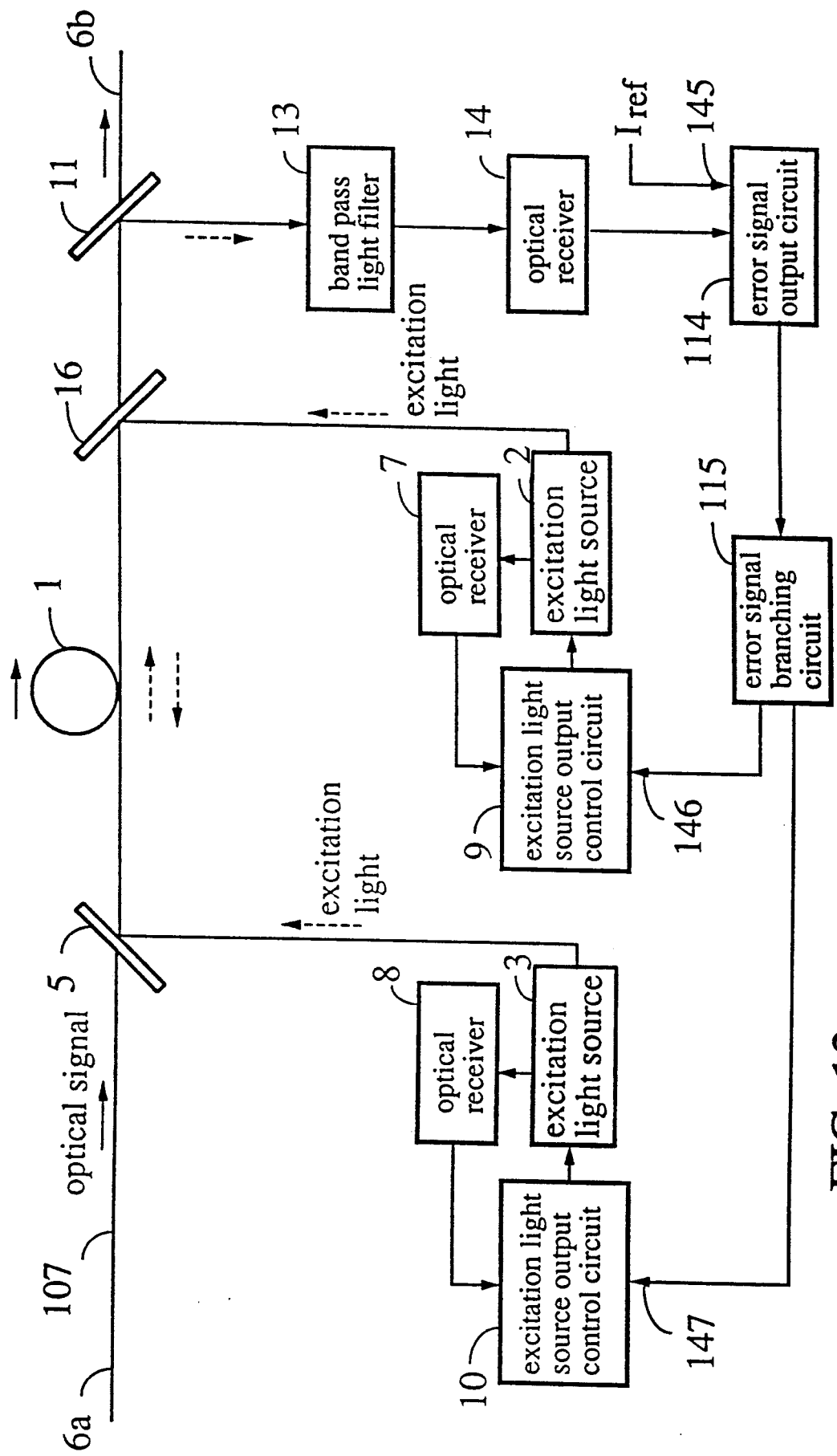
FIG. 12 is a block diagram of an optical fiber amplifier of the seventh embodiment of the present invention.

FIG. 12 is a block diagram of an optical fiber amplifier of the seventh embodiment of the present invention. These components referred to by the same numbers in FIG. 12 are identical or comparable to those referred to by the same numbers in FIG. 6 and FIG. 11 and their explanation will be omitted. In the seventh embodiment in FIG. 12, the operation of the circuit is the same as that of FIG. 6. The only difference from FIG. 6 is in that the excitation lights are inputted to the input terminal and the output terminal of the optical fiber doped with rare earth 1 from the optical coupler 5 and from the optical coupler 11, respectively.

In the above embodiment one or two excitation light sources are supplied to the circuit, but a plurality of excitation light sources can be supplied to the circuit in a similar manner for obtaining similar functions.

Embodiment 8

Figure 13:
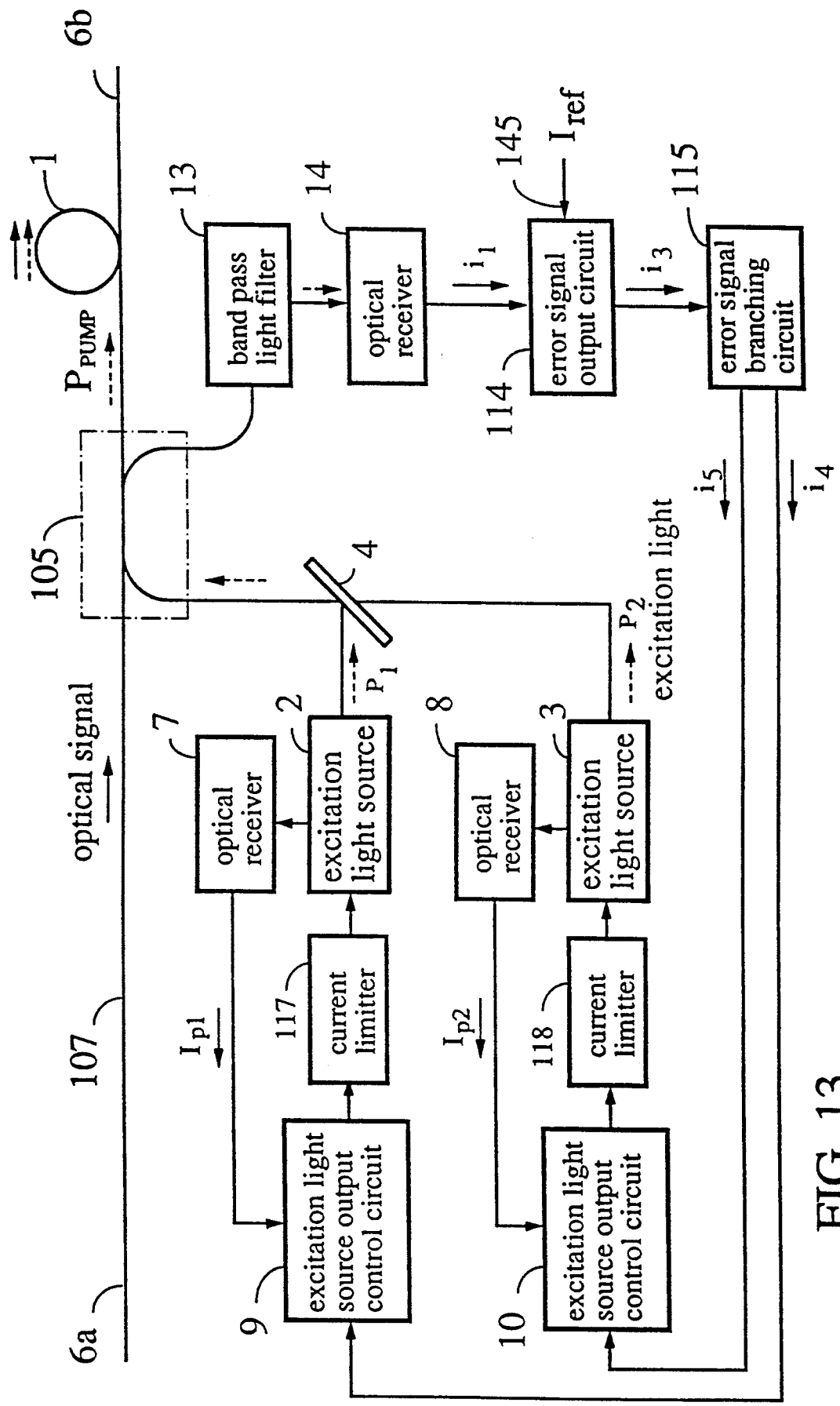
FIG. 13 is a block diagram of an optical fiber amplifier of the eight embodiment of the present invention.

One of the embodiments of the present invention is explained using FIG. 13 to FIG. 17. FIG. 13 is a block diagram of an optical fiber amplifier of the eight embodiment of the present invention having two excitation light sources. 1, 2, 3, 4, 6a and 6b in FIG. 13 are the same as those in FIG. 19. In FIG. 13, 105 is an optical coupler which synthesize an input optical signal from the optical signal input terminal 6a and an excitation output light from the optical coupler 4. One of the terminals is connected to the optical fiber doped with rare earth 1 and another terminal is connected to a band pass light filter 13 which includes a multi-layer dielectric film and causes the excitation light having a wavelength of 1.48 μm to pass and the optical signal having a wavelength of 1.53 μm or 1.55 μm to prevent to pass.

14 is a optical receiver for receiving a passing light through the bandpass light filter. 114 is an error signal output circuit for amplifying a difference between a receiving current from the optical receiver 14 and a reference signal inputted to the reference current input terminal 145. 115 is an error signal branching circuit for branching the current received from the error signal output circuit 114. 7 and 8 are optical receivers for receiving a part of the output light from the excitation light sources 2 and 3. 9 and 10 are excitation light source control circuits for controlling the output signals of the excitation light sources 2 and 3 in response to the output currents of error signal branching circuit 15 and the output currents of the optical receivers 7 and 8. 117 and 118 are current limiters for limiting the output currents from the excitation light source control circuits 9 and 10 to the excitation light sources 2 and 3 by the predetermined maximum values, respectively.

Figure 14:
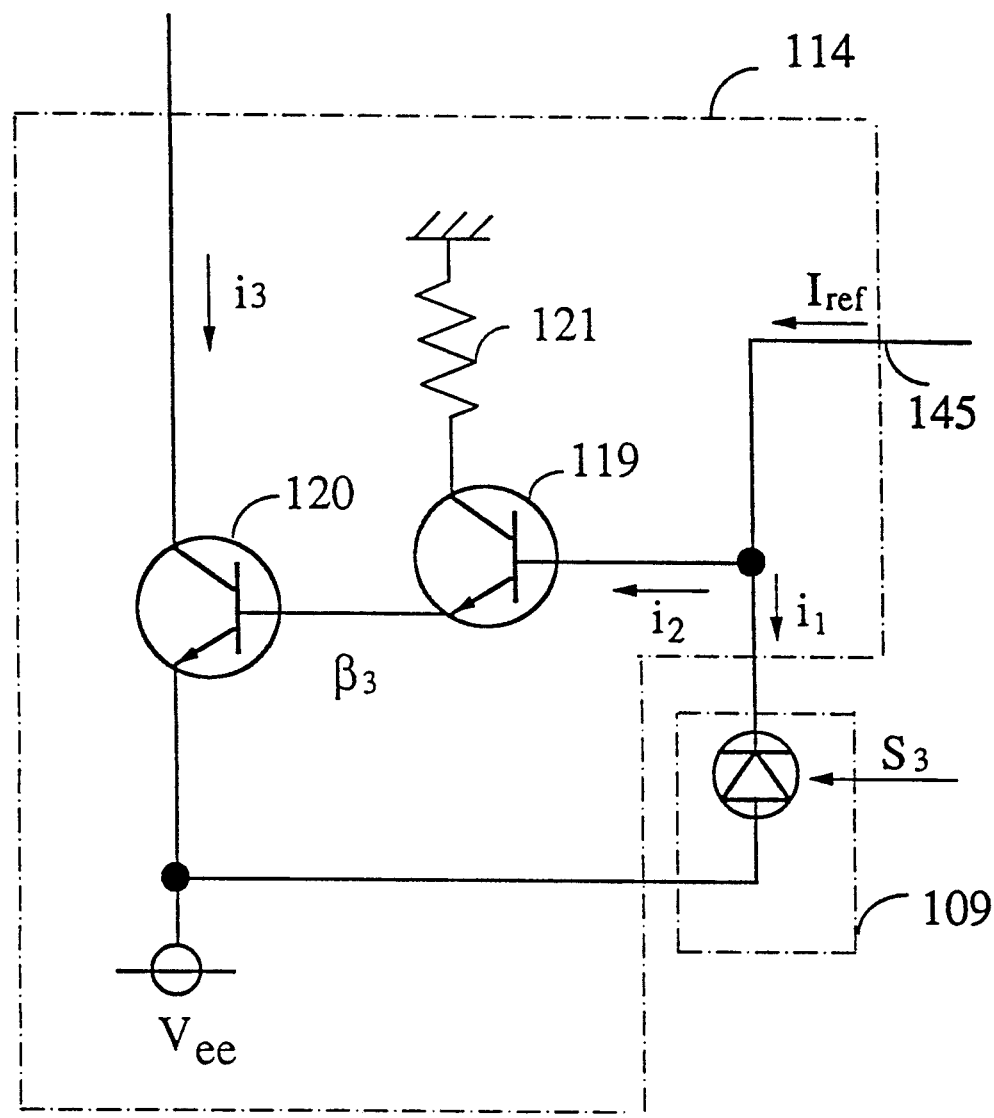
FIG. 14 is a circuit diagram of a detailed construction of the receiving current amplifier of the eighth embodiment of the present invention.
Figure 15:
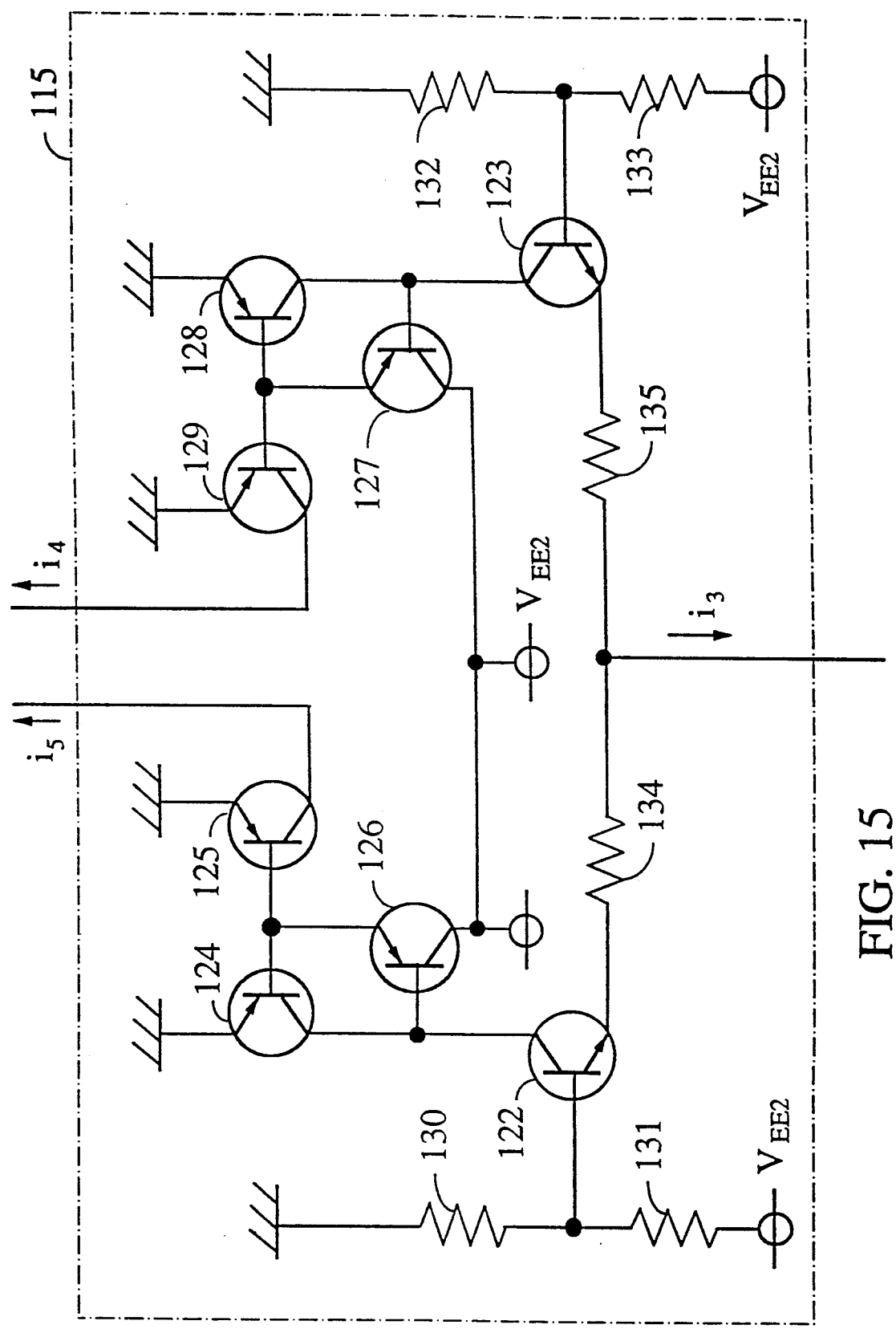
FIG. 15 is a circuit diagram of a detailed construction of the error signal branching circuit of the eighth embodiment of the present invention.

FIGS. 14, 15, 16, and 17 are detailed circuit diagrams of the optical fiber amplifier shown in FIG. 14. FIG. 14 is a detailed circuit diagram of the error signal output circuit 114. In FIG. 14, 119 and 120 are transistors connected in a darlington pair. 121 is a resistor. FIG. 15 is a detailed circuit diagram of the error signal branching circuit 115. In FIG. 15, 122 and 123 comprises a differential amplifier. 124, 125, 126, 127, 128 and 129 are transistors which comprises mirror circuit. 130, 131, 132, 133, 134 and 135 are resistors.

Figure 16:
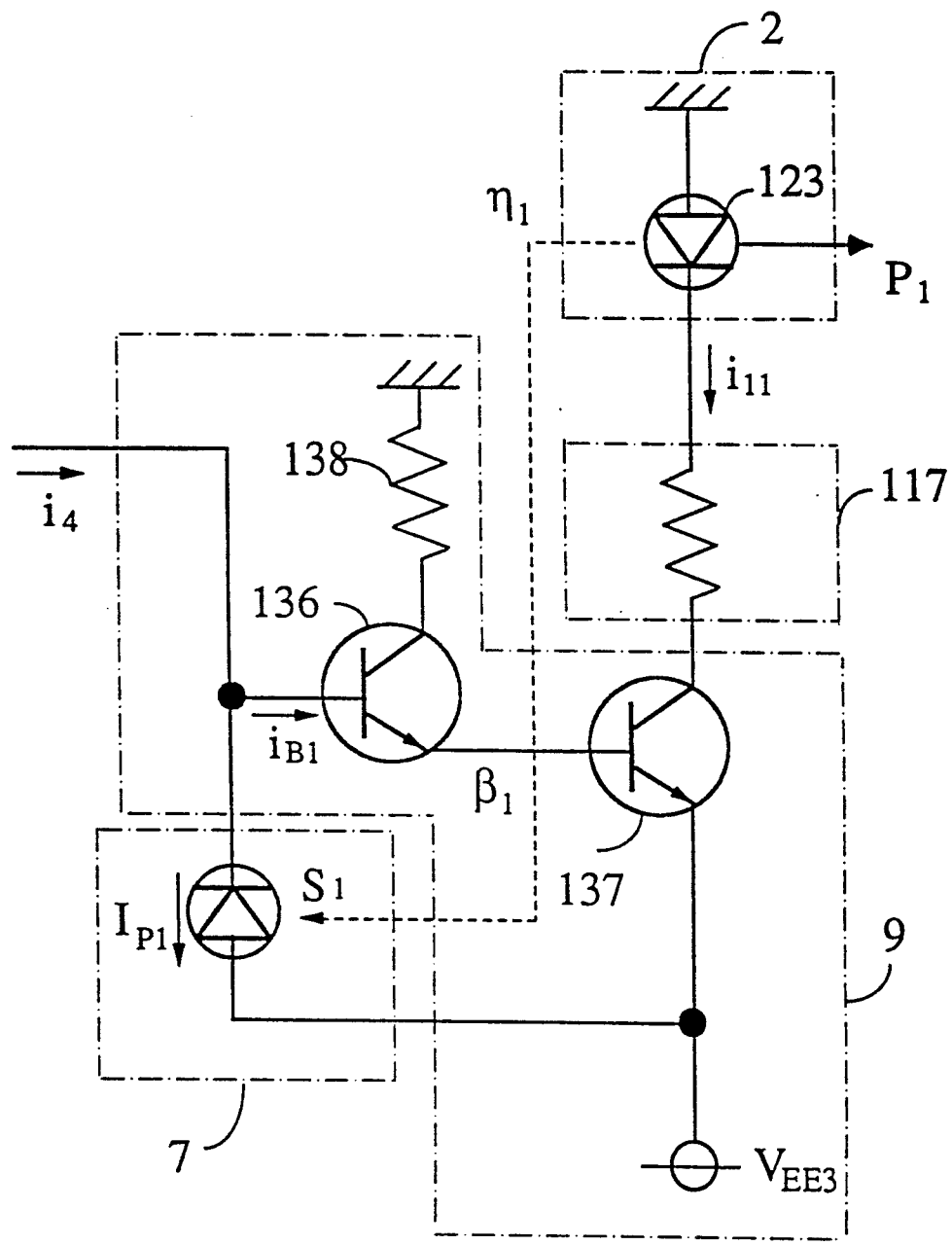
FIG. 16 is a circuit diagram of a detailed construction of the excitation light source control circuit 9 of the eighth embodiment of the present invention.
Figure 17:
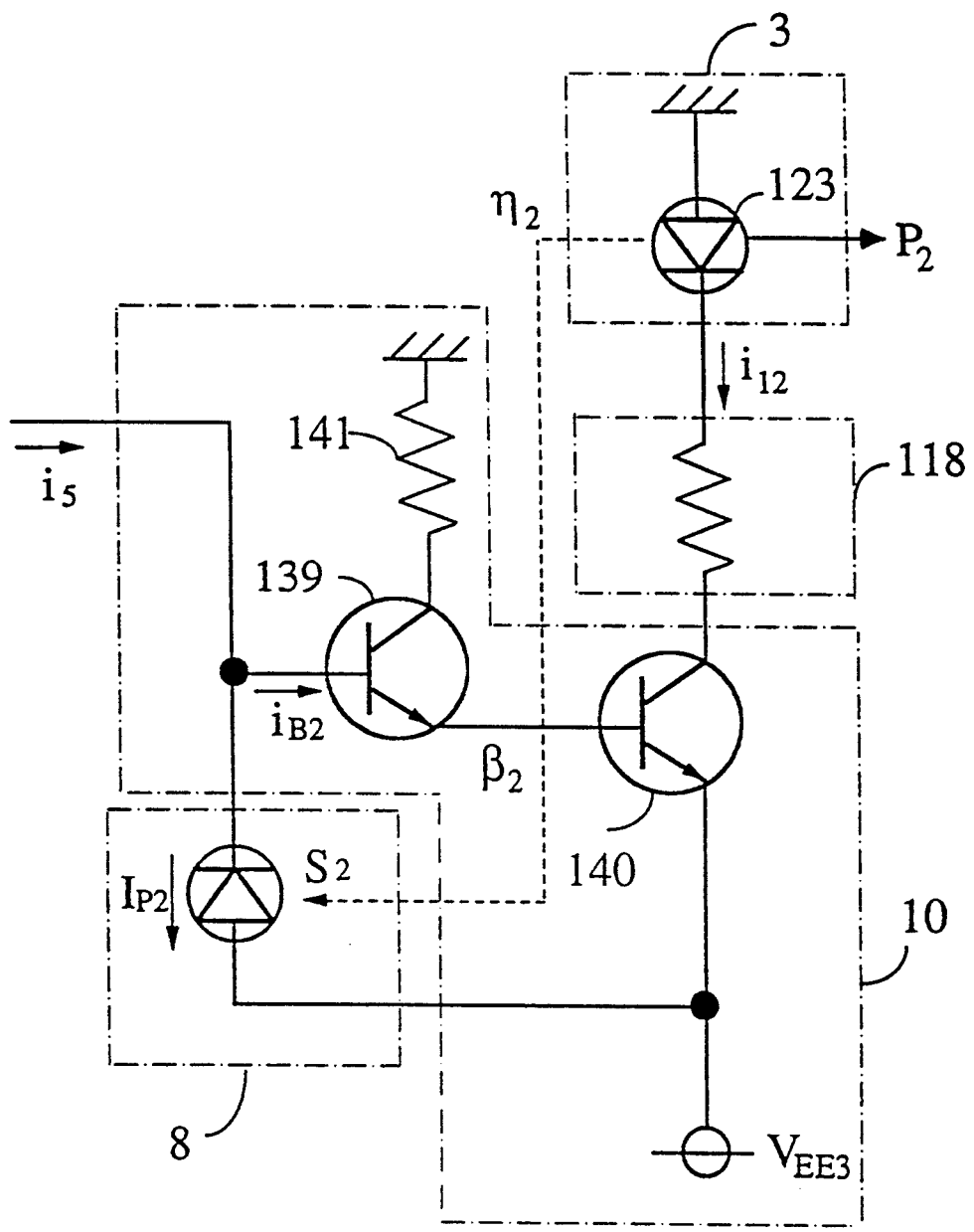
FIG. 17 is a circuit diagram of a detailed construction of the excitation light source control circuit 10 of the eighth embodiment of the present invention.

FIG. 16 is a detailed circuit diagram of the excitation light source control circuit 9. In FIG. 16, 136 and 137 are transistors connected in a darlington pair. 138 is a resistor. 117 is a resistor for limiting current. FIG. 17 is a detailed circuit diagram of the excitation light source control circuit 10 as well as FIG. 16. In FIG. 17, 139 and 140 are transistors connected in a darlington pair 141 is a resistor. 118 is a resistor for limiting current.

The operation of the optical fiber amplifier of the eighth embodiment of the present invention shown in FIG. 13 is explained hereinafter. A optical signal from the input terminal 6a is inputted to the optical fiber doped with rare earth 1 and is amplified in the optical fiber. On the other hand, the excitation lights from the excitation light sources 2 and 3 are synthesized at the optical coupler 4 and outputted to the optical fiber doped with rare earth 1. A part of the light is branched from the optical coupler 5 to the band pass light filter 13.

The bandpass light filter 13 prevents the excitation light having a wavelength of 1.48 μm to pass and causes the optical signal having a wavelength of 1.53 μm or 1.55 μm to pass to the optical receiver 14. The optical receiver 14 converts the received optical signal to an electrical signal and outputs it to the error signal output circuit 114. The error signal output circuit 114 compares the electrical signal received from the optical receiver 14 with a reference current $I_{ref}$ and amplifies a difference current and outputs it to the error signal branching circuit 115 as an error signal. The error signal branching circuit 115 branches the error signal to the excitation light source control circuits 9 and 10, respectively, at an arbitrary current branching ratio.

The excitation light source output control circuit 9, connected to the excitation light source 2 and the optical receiver 7 which receives a part of the output light of the excitation light source 2, controls an output of the excitation light source 2 in the first feed-back loop in response to the error signal from the error signal branching circuit 115. The excitation light source output control circuit 10, connected to the excitation light source 3 and the optical receiver 8 which receives a part of the output light of the excitation light source 3, controls an output of the excitation light source 3 in the second feed-back loop in response to the error signal from the error signal branching circuit 115.

Since the output optical signal outputted from the output terminal 6b is in proportion to the excitation light input power inputted to the optical fiber doped with rare earth 1 as shown in FIG. 20, the optical signal output power can be controlled so as to maintain the constant value by controlling the output power of the excitation light sources 2 and 3 in the feed-back loop.

If one of the excitation light sources 2 and 3 degrades their output characteristics, for example the excitation light source 2, the excitation light source output control circuit 9 causes the driving current to increase for maintaining the output of the excitation light source 2 within the maximum value of the limiter 117. But if the driving current exceeds the maximum limited current value of the limiter 117, the excitation light source output control circuit 9 can not drive the excitation light sources 2 for maintaining its output to be constant. Therefore, the output level of the excitation light source 2 gradually decreases. In accordance with the decrease of the output of the excitation light source 2, the error signal output circuit 114 generates an error signal for increasing the light level of the excitation light source 3, which controls the drive current of the excitation light source output control circuit 10. The excitation light source output control circuit 10 increases the driving current of the excitation light source 3, which is normally operating, according to the error signal for maintaining the excitation light level outputted to the optical fiber doped with rare earth 1 through the optical coupler 5.

In FIG. 13, a first feed-back loop includes the optical receiver 7 (or 8), the excitation light source output control circuits 9 (or 10) and the excitation light source 2 (or 3). A second feed-back loop comprises the optical receiver 14, the error signal output circuit 114, the excitation light source output control circuits 9 (or 10) and the excitation light source 2 (or 3). The response time constant of the first feed-back loop is selected to be much smaller than that of the second feed-back loop.

When the optical signal inputted to the optical receiver 14 maintains a constant level, the output levels of the excitation light sources 2 and 3 are controlled to be desired constant values by the first feed-back loop. Therefore, the variation of the threshold current and differential quantization efficiency are absorbed if the outputs of the excitation light sources 2 and 3 vary by the ambient temperature variation, and the output levels of the excitation light sources 2 and 3 are maintained constant.

When the optical signal level inputted to the optical receiver 14 varies in response to the variation of the wavelength of the excitation light source and the loss of the optical coupler, the output error signal of the error signal output circuit 114 varies in the second feed-back loop. Then the output error signal from the error signal output circuit 114 is controlled to be a desired value by controlling the excitation light sources 2 and 3 through the first feed-back loop. As a result, the optical signal output from the output terminal 6b is maintained at a desired constant value. As described above, if the circuit is designed so that the response time constant of the first feed-back loop is selected to be much smaller than that of the second feed-back loop, the amplified output optical signal level can be controlled to be always stable.

An operation of the embodiment of the present invention is explained using FIG. 14 to FIG. 17. Variables used in the equations are defined as follows.

Ppump: excited light level at the input terminal of the optical fiber doped with rare earth 1 (output level of the optical coupler 5)

$P_1$: light output level of the excitation light source 2

$P_2$: light output level of the excitation light source 3

$k_1$: total passing losses through the optical couplers 4 and 5 for the excited light $k_2$: total losses of branching loss of the optical coupler 5 for the excited light and passing loss through the bandpass light filter 13 for the optical signal $S_m$: receiving sensitivity of the optical receiver 14

$I_{ref}$: reference current inputted to the error signal output circuit 114

$S_1$: receiving sensitivity of the optical receiver 7 (including the coupling efficiency between the optical receiver 7 and the excitation light source 2)

$S_2$: receiving sensitivity of the optical receiver 8 (including the coupling efficiency between the optical receiver 8 and the excitation light source 3)

$\beta_1$: current amplification factor of the darlington transistors 136, 137

$\beta_2$: current amplification factor of the darlington transistors 139, 140

$\eta_1$: differential quantization efficiency of the laser diode used for the excitation light source 2

$\eta_2$: differential quantization efficiency of the laser diode used for the excitation light source 3

$i_{f1}$: direct bias current of the laser diode used for the excitation light source 2

$i_{f2}$: direct bias current of the laser diode used for the excitation light source 3

$I_{th1}$: threshold current of the laser diode used for the excitation light source 2

$I_{th2}$: threshold current of the laser diode used for the excitation light source 3

$I_{p1}$: light current of the optical receiver 7 used for the excitation light source 2

$I_{p2}$: light current of the optical receiver 8 used for the excitation light source 3

In the detailed circuit diagram of the error signal output circuit 114 of FIG. 14, the following equation is obtained.

$$i_2 = I_{ref} - i_1 \tag{53}$$

$$i_1 = S_3 \cdot K_2 \cdot P_{pump} \tag{54}$$

$$i_3 = \beta_3 \cdot i_2 \tag{55}$$

From the equation (53)~(55), $i_3$ of the error signal output circuit 114 is obtained as follows.

$$i_3 = \beta_3 \cdot (I_{ref} - S_3 \cdot K_2 \cdot P_{pump}) \tag{56}$$

FIG. 15 is a circuit diagram of the error signal branching circuit 115 which branches the error signal amplified in the error signal output circuit 114 to the excitation light source control circuits 9 and 10, respectively, at an arbitrary current branching ratio. This circuit is an example which comprises a differential amplifier. In the figure, the base potential of the transistor 122 and 123 can be varied by the resistors 130, 131, 132, 133 and 134 and the output current $i_4$ and $i_5$ can be selected in an arbitrary branching ratio.

Assume that the branching ratio is a:b, and if $$a_1 = a/(a+b) \tag{57}$$

$$b_1 = b/(a+b) \tag{58}$$

then, the $i_4$ and $i_5$ is obtained in the following equations.

$$i_4 = a_1 \cdot i_3 = a_1 \cdot \beta_3 \cdot (I_{ref} - S_3 \cdot K_2 \cdot P_{pump}) \tag{59}$$

$$i_5 = b_1 \cdot i_3 = b_1 \cdot \beta_3 \cdot (I_{ref} - S_3 \cdot K_2 \cdot P_{pump}) \tag{60}$$

FIG. 16 is a circuit diagram of the excitation light source control circuit 9. The circuit controls the output light level of the excitation light source 2 by the current $i_4$ from the error signal branching circuit 115 and light current $I_{p1}$ from the optical receiver 7. The circuit suppresses the variation of the differential quantization efficiency $\eta_1$ of the excitation light source 2 and the variation of the light output in response to the variation of the threshold current $I_{th1}$ of the laser diode in the excitation light source 2 generated according to the temperature variation, even if the current $i_4$ from the error signal branching circuit 115 is constant.

From FIG. 16, the following equations are obtained.

$$I_{B1} = i_4 - I_{p1} \tag{61}$$

$$I_{p1} = S_1 \cdot P_1 \tag{62}$$

$$i_{11} = \beta_1 \cdot I_{B1} \tag{63}$$

$$P_1 = \eta_1 \cdot (i_{11} - I_{th1}) \tag{64}$$

From the equations (61)~(64), the light output level $P_1$ of the excitation light source 2 is obtained as follows.

$$P_1 = (i_4 - I_{th1}/\beta_1)/[S_1\{1 + 1/(S_1 \cdot \beta_1 \cdot \eta_1)\}] \tag{65}$$

Since $\beta_1$ has a very large value in the darlington connection, $$S_1 \cdot \beta_1 \cdot \eta_1 >> 1, \quad i_4 >> I_{th1}/\eta_1 \tag{66}$$

then, the equation (13) can be changed as follows.

$$P_1 = i_4/S_1 \tag{67}$$

FIG. 17 is a circuit diagram of the excitation light source control circuit 10. The circuit controls the output light level of the excitation light source 3 by the current $i_5$ from the error signal branching circuit 115 and light current $I_{p2}$ from the optical receiver 8.

The light output level $P_2$ of the excitation light source 3 is obtained as follows in the same manner described above in the excitation light source control circuit 9.

$$P_2 = i_5/S_2 \tag{68}$$

From the equation (59), (67), the light output level $P_1$ of the excitation light source 2 is obtained as follows.

$$P_1 = a_1 \cdot \beta_3 (I_{ref} - S_3 \cdot K_2 \cdot P_{pump})/S_1 \tag{69}$$

From the equations (60), (68), the light output level $P_2$ of the excitation light source 3 is obtained as follows.

$$P_2 = b_1 \cdot \beta_3 (I_{ref} - S_3 \cdot K_2 \cdot P_{pump})/S_2 \tag{70}$$

where, $P_{pump}$ is an excited light level inputted to the optical fiber doped with rare earth 1 and is obtained as follows.

$$P_{pump} = K_1(P_1 + P_2) \tag{71}$$

From the equations (67)~(69), $P_{pump}$ is obtained as follows.

$$P_{pump} = K_1 \cdot \beta_3 \cdot (a_1/S_1 + b_1/S_2) \cdot I_{ref}/\{1 + K_1 \cdot K_2 \cdot S_3 \cdot \beta_3 \cdot (a_1/S_1 + b_1/S_2)\} \tag{72}$$

Since $\beta_3$ has a very large value in the darlington connection, $$P_{pump} = I_{ref}/K_2 \tag{73}$$

Therefore, the output $P_{pump}$ of the optical coupler 4 can be controlled to have a constant value decided by the reference current $I_{ref}$ inputted to the error signal output circuit 114 in spite of the parameters of the excitation light sources 2 and 3 and the parameters of the excitation light source control circuits 9 and 10.

Embodiment 9

Figure 18:
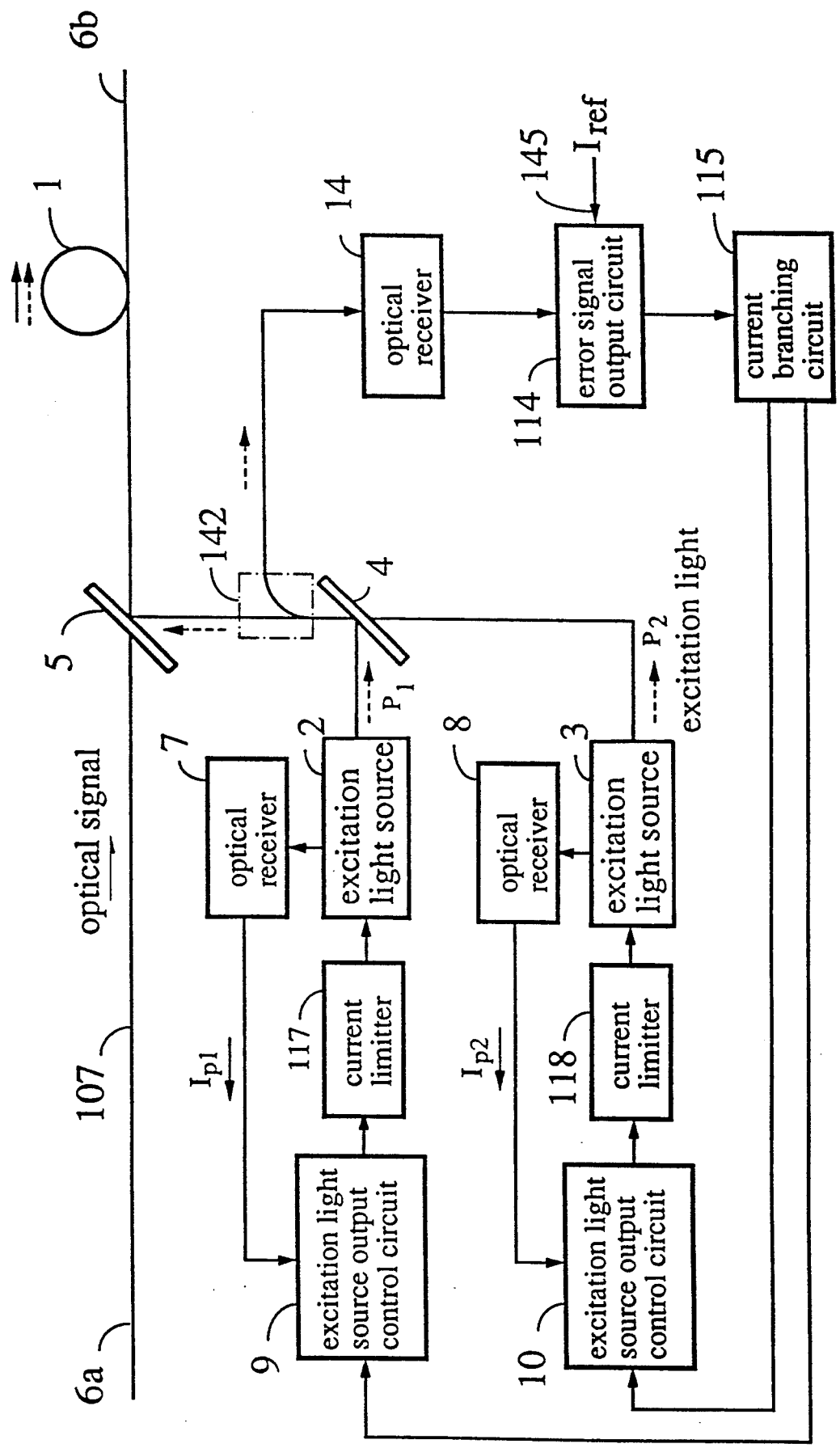
FIG. 18 is a block diagram of an optical fiber amplifier of the ninth embodiment of the present invention.

FIG. 18 is a block diagram of an optical fiber amplifier of another embodiment of the present invention. 1~17 of FIG. 18 are the same as those in FIG. 13. For example, 142 is an optical coupler having a branching ratio of 99:1. In the present embodiment, the operation of the circuit is the same as that of FIG. 13. The only difference from FIG. 13 is in that the optical coupler 142 is inserted between the optical coupler 4 and the optical coupler 5, and a part of the excitation light is branched from the optical coupler 142.

In the above embodiment one or two excitation light sources are supplied to the circuit, but a plurality of excitation light sources can be supplied to the circuit in a similar manner for obtaining similar functions. In the above embodiment, the direction of the excitation light inputted to the optical fiber doped with rare earth 1 is the same as that of the optical signal. But, if the direction of the excitation light inputted to the optical fiber doped with rare earth 1 is inverted, the same effect is obtained.

What is claimed is:

1. An optical fiber amplifier, comprising:
   an optical fiber for amplifying an optical signal;
   at least one excitation light source coupled to the optical fiber for transmitting an excitation light signal to the optical fiber;
   an optical receiver coupled to each said excitation light source to receive part of the excitation light signal;
   an output light detecting means coupled to said optical fiber for detecting the amplified optical signal and outputting an error signal; and
   an excitation light source control circuit for each said excitation light source for controlling the transmission of the excitation light signal by said excitation light source in response to the error signal and the part of the excitation light signal received by said optical receiver.

2. An optical fiber amplifier comprising:
   (a) an optical fiber for amplifying an optical signal,
   (b) at least one excitation light source control loop means for controlling the transmission of an excitation light signal to said optical fiber, wherein each said excitation light source control loop means comprises:
      (i) an excitation light source coupled to said optical fiber for transmitting the excitation light signal to said optical fiber;
      (ii) an optical receiver coupled to said excitation light source to receive part of the excitation light signal transmitted by said excitation light source; and
      (iii) an excitation light source control circuit coupled to said optical receiver and to said excitation light source for controlling the transmission of said excitation light signal by said excitation light source, and
   (c) at least one output light detecting control loop means for controlling the transmission of the excitation light signal to said optical fiber, wherein each said output light detecting control loop means comprises an output light detecting means for detecting the amplified optical signal on said optical fiber and outputting an error signal to each said excitation light source control circuit,
      with each said excitation light source control circuit responsive to the part of the excitation light signal and to the error signal.

3. A method for amplifying an optical signal using an optical fiber, comprising steps of:
   amplifying the optical signal by applying the optical signal and an excitation light signal from at least one excitation light sources to the optical fiber;
   detecting the amplified optical signal level;
   receiving part of the excitation light signal from each excitation light source;
   controlling the excitation light signal output by each said excitation light source with an excitation light source control circuit for each said excitation light source, with each said excitation light source control circuit responsive to the the part of the excitation light signal and the amplified optical signal level.

4. An optical fiber amplifier, having an optical fiber doped with rare earth for amplifying an optical signal applied to the optical fiber and a plurality of excitation light sources coupled to the optical fiber for transmitting an excitation light signal to the optical fiber, comprising:
   an excitation light source control circuit coupled to each said excitation light source for controlling the transmission of the excitation light signal by each said excitation light source;
   a band pass light filter for filtering the amplified signals,
   an error signal output circuit for detecting the filtered amplified optical signal and for outputting a difference error signal based on the difference between the amplified optical signal and a reference signal level; and
   an error signal branching circuit coupled to said error signal output circuit for branching the difference error signal received from said error signal output circuit to each said excitation light source control circuit, wherein each said excitation light source control circuit is responsive to the difference error signal.

5. The optical fiber amplifier according to the claim 4, wherein each excitation light source control circuit comprises a darlington connection.

6. The optical fiber amplifier according to the claim 4, wherein the error signal output circuit comprises a darlington connection.

7. An optical fiber amplifier, having an optical fiber doped with rare earth for amplifying the light and at least one excitation light source comprising:
   (a) a plurality of optical receivers having the same number as that of the excitation light sources for receiving a part of the outputs of said excitation light sources, respectively;
   (b) a plurality of excitation light source control circuits, wherein each circuit is constructed with a Darlington current amplifier, and each input terminal in said excitation light source control circuits is connected to a reference current input terminal and a cathode of the optical receivers;
   (c) a plurality of current limiters for limiting the respective upper current outputted from the excitation light source control circuits to the excitation light sources;
   (d) an error signal output circuit, wherein the circuit is constructed with a darlington current amplifier, and an input terminal in said error signal output circuit is connected to a reference current input terminal and a cathode of the light receiving devices; and
   (e) an error signal branching circuit, wherein an input terminal of the error signal branching circuit is connected to the error signal output circuit, and an output of the error signal branching circuit is connected to the at least an excitation light source control circuit.

8. The optical fiber amplifier according to the claim 1, wherein said output light detecting means further comprises an error signal circuit for comparing the amplified optical signal with a reference signal to produce the error signal.

9. The optical fiber amplifier according to the claim 2, wherein said output light detecting means further comprises an error signal circuit for comparing the amplified optical signal with a reference signal to produce the error signal.

10. The optical fiber amplifier according to the claim 9, further comprising means for combining said excitation light signals prior to coupling said excitation signals to said optical fiber.

11. The optical fiber amplifier according to the claim 9, further comprising means for coupling each said excitation light signals to a different location on said optical fiber.

12. The optical fiber amplifier according to the claim 10, wherein said error signal circuit comprises an operational amplifier.

13. The optical fiber amplifier according to the claim 10, wherein each said excitation light source output control circuit comprises a darlington connection.

14. The optical fiber amplifier according to the claim 11, wherein said error signal circuit comprises an operational amplifier.

15. The optical fiber amplifier according to the claim 11, wherein each said excitation light source output control circuit comprises a darlington connection.

16. The method for amplifying according to claim 3 further comprising the step of comparing the detected amplified optical signal with a reference signal to produce a difference signal, wherein each said excitation light source control circuit is responsive to said difference signal.

17. The method for amplifying according to claim 16 wherein the step of applying further comprises the step of combining the excitation light signal from more than one excitation light source before applying to the optical fiber.

18. The optical fiber amplifier according to the claim 4, further comprising an optical receiver coupled between each said excitation light source and each said excitation light source control circuit for receiving part of the excitation light signal transmitted, wherein each said excitation light source control circuit is also responsive to the part of the excitation light signal.

19. The optical fiber amplifier according to the claim 18, further comprising means for combining said excitation light signals prior to transmitting said excitation signals to said optical fiber.

20. The optical fiber amplifier according to the claim 18, further comprising means for coupling each said excitation light signal to a different location on said optical fiber.

21. An optical fiber amplifier, having an optical fiber doped with rare earth for amplifying the light and a plurality of excitation light sources for exciting the optical signal transmitting through the optical fiber, comprising:

(a) a plurality of excitation light source control circuits for controlling the output signal of the excitation light sources in order to obtain a constant fiber output;

(b) an error signal output circuit for outputting a difference error signal between an electrical signal level corresponding to the output optical signal from the optical fiber doped with rare earth and a reference signal level;

(c) an error signal branching circuit for branching the error signal received from the error signal output circuit to the respective excitation light source control circuit and for feedbacking the branched error signals to the excitation light source control circuit as reference currents;

(d) a plurality of optical receivers, each for receiving a part of the light output from the excitation light source;

wherein each excitation light source control circuit is constructed with darlington connection, wherein each input terminal in said excitation light source control circuit is connected to a cathode of the optical receiver for receiving the part of the output light from the excitation light source, and to a reference current input terminal for inputting the reference current, and each output terminal is connected to the above excitation light source.

22. An optical fiber amplifier, having an optical fiber doped with rare earth for amplifying the light and a plurality of excitation light sources for exciting the optical signal transmitting through the optical fiber, comprising:

(a) a plurality of excitation light source control circuits for controlling the output signal of the excitation light sources in order to obtain a constant fiber output;

(b) an error signal output circuit for outputting a difference error signal between an electrical signal lever corresponding to the output optical signal from the optical fiber doped with rare earth and a reference signal level;

(c) an error signal branching circuit for branching the error signal received from the error signal output circuit to the respective excitation light source control circuit and for feedbacking the branched error signals to the excitation light source control circuit as reference currents;

(d) a plurality of optical receivers, each for receiving a part of the light output from the excitation light source;

wherein the error signal output circuit is constructed using darlington connection, wherein an input terminal in the error signal output circuit is connected to a cathode of the optical receiver for receiving the part of the output light from the excitation light source, and to a reference current input terminal for inputting the reference current.

* * * * *